United States Patent
Ahn et al.

(10) Patent No.: US 12,310,176 B2
(45) Date of Patent: May 20, 2025

(54) DISPLAY DEVICE

(71) Applicant: Samsung Display Co., LTD., Yongin-si (KR)

(72) Inventors: Jung Hyun Ahn, Suwon-si (KR); Cheol Ku Kang, Uiwang-si (KR); Ki Hoon Park, Yongin-si (KR); Hyun Deok Im, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 777 days.

(21) Appl. No.: 17/565,804

(22) Filed: Dec. 30, 2021

(65) Prior Publication Data
US 2022/0262867 A1   Aug. 18, 2022

(30) Foreign Application Priority Data
Feb. 17, 2021   (KR) ................. 10-2021-0021148

(51) Int. Cl.
*H10K 59/121*   (2023.01)
*H10K 59/122*   (2023.01)

(52) U.S. Cl.
CPC ......... *H10K 59/121* (2023.02); *H10K 59/122* (2023.02)

(58) Field of Classification Search
CPC ............................ H10K 59/121; H10K 59/122
See application file for complete search history.

(56) References Cited

U.S. PATENT DOCUMENTS

2021/0335765 A1*   10/2021   Lee ....................... H01L 24/24

FOREIGN PATENT DOCUMENTS

| KR | 10-1490758 | 2/2015 |
| KR | 10-2020-0041429 | 4/2020 |

* cited by examiner

*Primary Examiner* — Douglas M Menz
(74) *Attorney, Agent, or Firm* — KILE PARK REED & HOUTTEMAN PLLC

(57) ABSTRACT

A display device includes a first electrode and a second electrode spaced apart from each other and disposed on a substrate; a first sub-bank disposed on the first electrode and exposing an end of the first electrode facing the second electrode; a second sub-bank disposed on the second electrode and exposing an end of the second electrode facing the first electrode; a step pattern disposed on the second electrode and overlapping at least the end of the second electrode; and a light-emitting element disposed between the first sub-bank and the second sub-bank.

6 Claims, 27 Drawing Sheets

200: 210, 220
400: 410, 420
700: 710, 720

DISPLAY DEVICE

CROSS-REFERENCE TO RELATED APPLICATION(S)

This application claims priority to and benefits of Korean Patent Application No. 10-2021-0021148 under 35 U.S.C. § 119, filed on Feb. 17, 2021 in the Korean Intellectual Property Office, the entire contents of which are incorporated herein by reference.

BACKGROUND

1. Technical Field

The disclosure relates to a display device.

2. Description of the Related Art

Display devices become more and more important as multimedia technology evolves. Accordingly, a variety of types of display devices such as organic light-emitting display (OLED) devices and liquid-crystal display (LCD) devices are currently used.

Display devices may include a display panel such as an organic light-emitting display panel or a liquid-crystal display panel for displaying images. Among them, the light-emitting display panel may include light-emitting elements. For example, light-emitting diodes (LEDs) may include an organic light-emitting diode (OLED) using an organic material as a luminescent material, and an inorganic light-emitting diode using an inorganic material as a luminescent material.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the disclosure provide a display device having an improved alignment of light-emitting elements.

It should be noted that objects of the disclosure are not limited to the above-mentioned objects, and other objects will be apparent to those skilled in the art from the following descriptions.

According to an aspect of the disclosure, a display device may include a first electrode and a second electrode spaced apart from each other and disposed on a substrate; a first sub-bank disposed on the first electrode and exposing an end of the first electrode facing the second electrode; a second sub-bank disposed on the second electrode and exposing an end of the second electrode facing the first electrode; a step pattern disposed on the second electrode and overlapping at least the end of the second electrode; and a light-emitting element disposed between the first sub-bank and the second sub-bank.

A thickness of the step pattern may be less than a thickness of the second sub-bank.

The step pattern and the second sub-bank may be integral with each other.

A first end of the light-emitting element may be disposed on the end of the first electrode, and a second end of the light-emitting element may be disposed on the end of the second electrode and the step pattern.

A distance between the first end of the light-emitting element and a surface of the substrate may be less than a distance between the second end of the light-emitting element and the surface of the substrate.

The step pattern may be disposed between the second electrode and the second end of the light-emitting element.

According to another aspect of the disclosure, a display device may include a first bank disposed on a substrate, and comprising a first sub-bank and a second sub-bank spaced apart from each other; a first electrode disposed on the first sub-bank; a second electrode spaced apart from the first electrode and disposed on the second sub-bank; a step pattern overlapping an end of the second electrode facing the first electrode; and a light-emitting element disposed between the first sub-bank and the second sub-bank, wherein the first electrode and the second electrode are disposed on a same layer.

The end of the second electrode may be extended from the second sub-bank and may be disposed between the first sub-bank and the second sub-bank.

A first end of the light-emitting element may be disposed on an end of the first electrode, a second end of the light-emitting element may be disposed on the step pattern and the end of the second electrode, and the end of the first electrode may be extended from the first sub-bank and may be disposed between the first sub-bank and the second sub-bank.

A distance between the first end of the light-emitting element and a surface of the substrate may be less than a distance between the second end of the light-emitting element and the surface of the substrate.

A thickness of the step pattern may be less than a thickness of the first bank.

The step pattern may be disposed on the end of the second electrode.

The end of the second electrode may be disposed on the step pattern.

According to another aspect of the disclosure, a display device may include a via layer disposed on a surface of a substrate and comprising a first region having a first thickness; and a second region having a second thickness, the second thickness being less than the first thickness; a first electrode disposed on the second region of the via layer; a second electrode spaced apart from the first electrode and disposed on the first region of the via layer; and a light-emitting element disposed between the first electrode and the second electrode and having a first end and a second end in a longitudinal direction of the light-emitting element, wherein the longitudinal direction of the light-emitting element is oblique with respect to the surface of the substrate.

The first end of the light-emitting element may be disposed on the first electrode, the second end of the light-emitting element may be disposed on the second electrode, and a distance between the first end of the light-emitting element and the surface of the substrate may be less than a distance between the second end of the light-emitting element and the surface of the substrate.

The display device may further comprise a bank comprising a first sub-bank that overlaps the first electrode; and a second sub-bank that overlaps the second electrode, wherein the first sub-bank does not overlap an end of the first electrode facing the second electrode, and the second sub-bank does not overlap an end of the second electrode facing the first electrode.

The first sub-bank may be disposed on the first electrode, and the second sub-bank may be disposed on the second electrode.

A step pattern may be disposed on the second electrode that overlaps the end of the second electrode facing the first electrode, wherein the step pattern and the second sub-bank may be integral with each other.

The first sub-bank may be disposed between the first electrode and the second region of the via layer, and the second sub-bank may be disposed between the second electrode and the first region of the via layer.

A step pattern may be disposed on the second electrode that overlaps the end of the second electrode facing the first electrode.

The details of one or more embodiments of the subject matter described in this specification are set forth in the accompanying drawings and the description below.

According to an embodiment, a display device may include a first electrode, a second electrode, and a step pattern overlapping an end of the second electrode facing the first electrode. The step pattern may serve to seat light-emitting elements so that they are inclined with respect to a surface of the substrate. During the process of aligning the light-emitting elements disposed between the first electrode and the second electrode, the light-emitting elements may be aligned by receiving the dielectrophoretic force by the electric field generated over the first electrode and the second electrode so that they are oriented in a direction. During the process of aligning light-emitting elements, since the light-emitting elements are seated obliquely with respect to a surface of the substrate by the step pattern, the light-emitting elements may be readily aligned in a direction for the same dielectrophoretic force. Accordingly, the alignment of the light-emitting elements can be improved.

It should be noted that effects of the disclosure are not limited to those described above and other effects of the disclosure will be apparent to those skilled in the art from the following descriptions.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
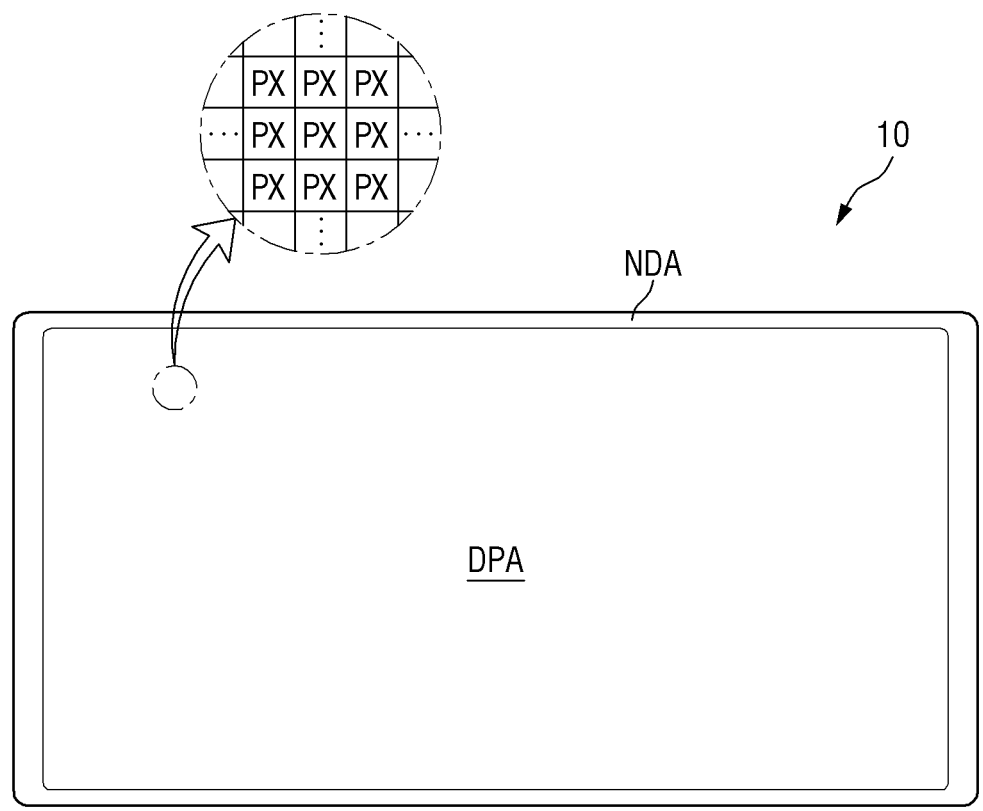
FIG. 1 is a schematic plan view of a display device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, sizes, thicknesses, ratios, and dimensions of the elements may be exaggerated for ease of description and for clarity. Like numbers refer to like elements throughout.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will also be understood that when a layer is referred to as being "on" another layer or substrate, it can be directly on the other layer or substrate, or intervening layers may also be present. The same reference numbers indicate the same components throughout the specification.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween.

It will be understood that the terms "connected to" or "coupled to" may include a physical or electrical connection or coupling.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments will be described with reference to the accompanying drawings.

FIG. 1 is a schematic plan view of a display device according to an embodiment.

Referring to FIG. 1, a display device 10 displays a moving image or a still image. A display device 10 may refer to any electronic device that provides a display screen. For example, the display device 10 may include a television set, a laptop computer, a monitor, an electronic billboard, the Internet of Things devices, a mobile phone, a smart phone, a tablet personal computer (PC), an electronic watch, a smart watch, a watch phone, a head-mounted display device, a mobile communications terminal, an electronic notebook, an electronic book, a portable multimedia player (PMP), a navigation device, a game console and a digital camera, a camcorder, etc. within the spirit and the scope of the disclosure.

The display device 10 may include a display panel for providing a display screen. Examples of the display panel may include an inorganic light-emitting diode display panel, an organic light-emitting display panel, a quantum-dot light-emitting display panel, a plasma display panel, a field emission display panel, etc. within the spirit and the scope of the disclosure. In the following description, an inorganic light-emitting diode display panel is employed as an example of the display panel 10, but the disclosure is not limited thereto. Any other display panel may be employed as long as the technical idea of the disclosure can be equally applied.

A first direction DR1, a second direction DR2 and a third direction DR3 are defined in the drawings. The display device 10 according to embodiments will be described with reference to the drawings. The first direction DR1 may be substantially perpendicular to the second direction DR2 in a plane. The third direction DR3 may be substantially perpendicular to the plane where the first direction DR1 and the second direction DR2 are located or disposed. The third direction DR3 may be substantially perpendicular to each of the first direction DR1 and the second direction DR2. In the following description of the display devices 10 according to embodiments, the third direction DR3 may refer to the thickness direction (or the display side) of the display device 10.

The display device 10 may have a substantially rectangular shape including longer sides in the first direction DR1 and shorter sides in the second direction DR2 when viewed from the top. Although the corners where the longer sides and the shorter sides of the display device 10 meet may form a right angle, this is merely illustrative. The display device 1 may have rounded corners. The shape of the display device 10 is not limited to that shown but may be modified in a variety of ways. For example, the display device 10 may have other shapes such as substantially a square, substantially a rectangle with substantially rounded corners (vertices), other polygons and substantially a circle.

A display surface may be located or disposed on one side or a side of the display device 10 in the third direction DR3, i.e., the thickness direction. In the following description, the upper side of the display device 10 refers to the side in the third direction DR3 where images are displayed, and the upper surface of the display device 10 refers to the surface facing the side in the third direction DR3, unless stated otherwise. The lower side refers to the opposite side in the third direction DR3, and likewise the lower surface refers to the surface facing the opposite side in the third direction DR3. As used herein, the terms "left," "right," "upper" and "lower" sides refer to relative positions in case that the display device 10 is viewed from the top. For example, the right side refers to one side or a side in the first direction DR1, the left side refers to the opposite side in the first direction DR1, the upper side refers to one side or a side in the second direction DR2, and the lower side refers to the opposite side in the second direction DR2.

The display device 10 may include the display area DPA and a non-display area NDA. In the display area DPA, images can be displayed. In the non-display area NDA, images are not displayed.

The shape of the display area DPA may follow the shape of the display device 10. For example, the shape of the display area DPA may have a or substantially rectangular shape generally similar to the shape of the display device 10 when viewed from the top. The display area DPA may generally occupy the majority of the center of the display device 10.

The display area DPA may include pixels PX. The pixels PX may be arranged or disposed in a matrix. The shape of each of the pixels PX may be substantially rectangular or substantially square when viewed from the top. In an embodiment, each of the pixels PX may include light-emitting elements made of inorganic particles.

The non-display area NDA may be disposed around the display area DPA. The non-display area NDA may surround the display area DPA entirely or partially or may be adjacent to the display area DPA. The non-display area NDA may form the bezel of the display device 10.

Figure 2:
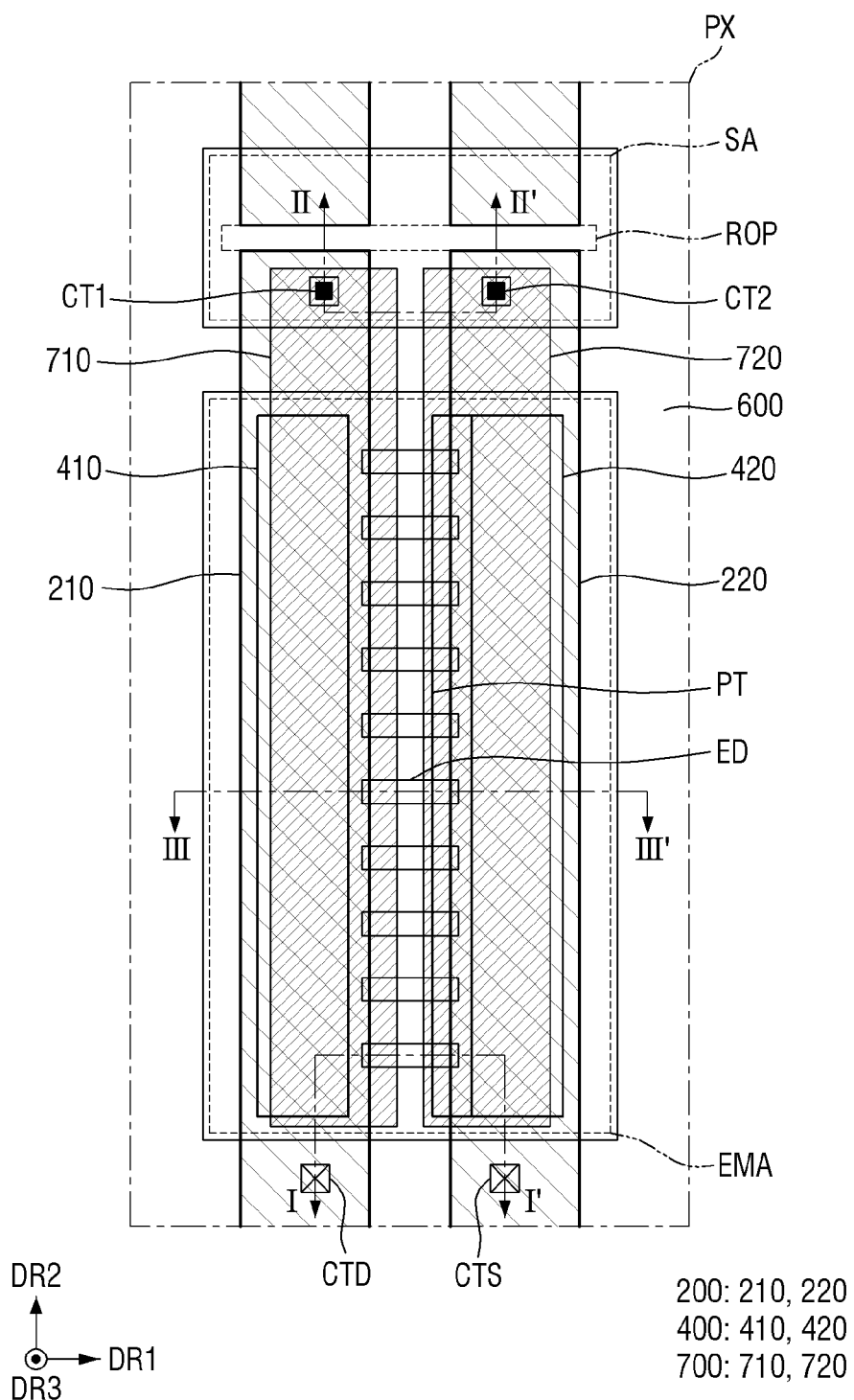
FIG. 2 is a schematic plan view showing a layout of a pixel of a display device according to an embodiment.
Figure 3:
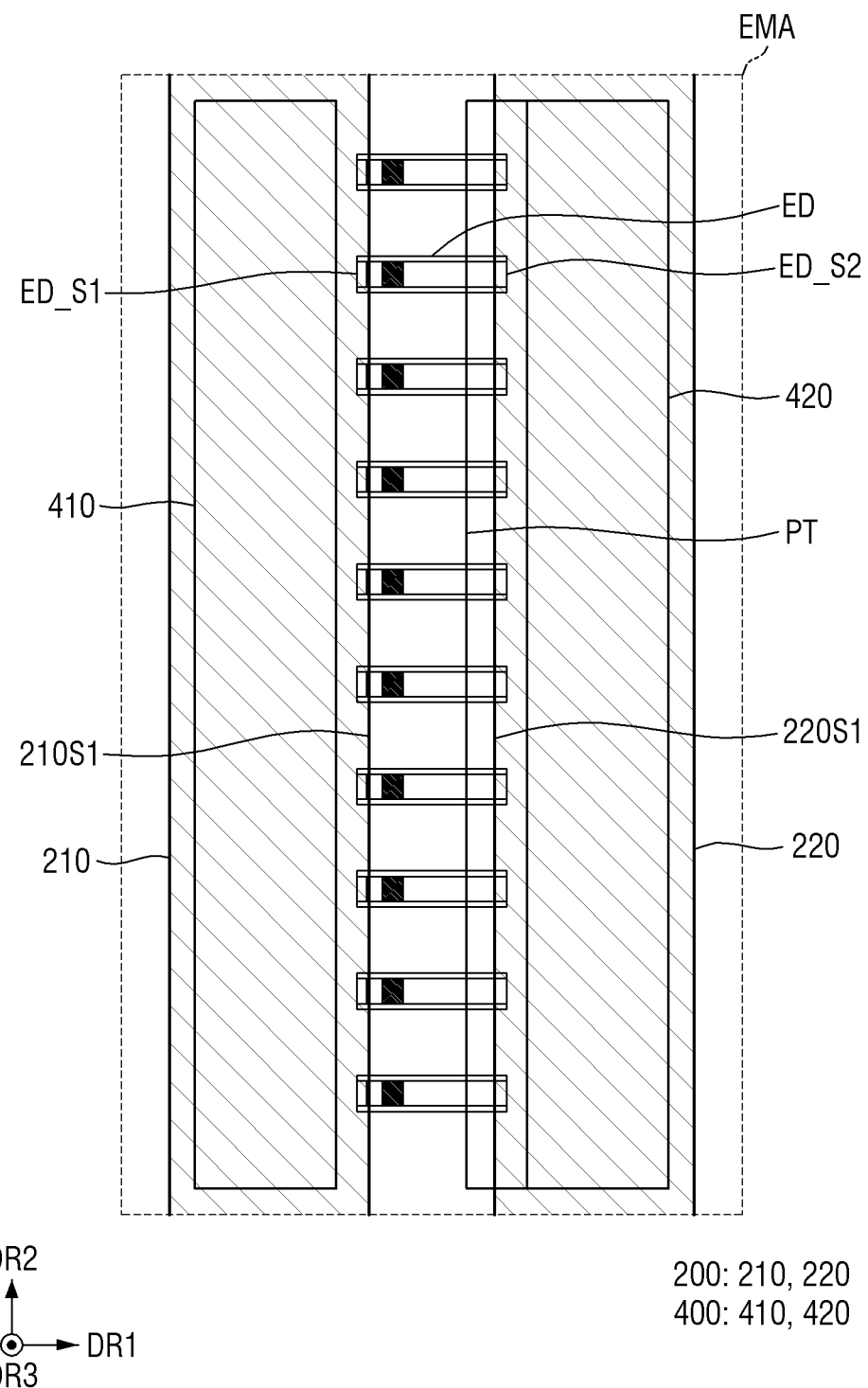
FIG. 3 is a schematic plan view showing a relative layout between an electrode layer and light-emitting diodes disposed in the emission area of the display device of FIG. 2.

FIG. 2 is a schematic plan view showing a layout of a pixel of a display device according to an embodiment. FIG. 3 is a or intersecting plan view showing a relative layout between an electrode layer and light-emitting diodes disposed in the emission area of the display device of FIG. 2.

Referring to FIGS. 2 and 3, one pixel PX of the display device 10 according to an embodiment may include an electrode layer 200, a first bank 400, a step pattern PT, light-emitting elements ED, contact electrodes 700 and a second bank 600.

Hereinafter, referring to FIGS. 2 and 3, the electrode layer 200, the first bank 400, the step pattern PT, the light-emitting elements ED, the contact electrodes 700 and the second bank 600 disposed in one pixel PX of the display device 10 according to an embodiment will be described briefly.

Each PX of the display device 10 may include an emission area EMA and a non-emission area. In the emission area EMA, light emitted from the light-emitting elements ED may exit. In the non-emission area, light emitted from the light-emitting elements ED do not reach and thus no light exits therefrom.

The emission area EMA may include an area where the light-emitting elements ED are disposed, and an area adjacent to it. The emission area may further include an area in which light emitted from the light-emitting elements ED is reflected or refracted by other elements to exit.

Each pixel PX may further include a subsidiary area SA disposed in the non-emission area. No light-emitting elements ED may be disposed in the subsidiary area SA. The subsidiary area SA may be disposed on the upper side of the emission area EMA (or one side or a side in the second direction DR2) within one pixel PX. The subsidiary area SA may be disposed between the emission areas EMA of neighboring pixels PX in the second direction DR2. The subsidiary area SA may include a region in which the electrode layer 200 and the contact electrodes 700 are electrically connected through contacts CT1 and CT2 to be described later.

The subsidiary area SA may include a separation region ROP. In the separation region ROP of the subsidiary area SA, a first electrode 210 and a second electrode 220 included the electrode layer 200 in a sub-pixel may be separated from a first electrode 210 and a second electrode 220 in another sub-pixel adjacent to the sub-pixel in the second direction DR2, respectively.

The second bank 600 may be disposed in a lattice pattern on the entire surface of the display area DPA including portions extended in the first direction DR1 and the second direction DR2 when viewed from the top. The second bank 600 may be disposed along the border of each pixel PX to distinguish adjacent pixels PX from one another. The second bank 600 may be disposed to surround the emission area EMA and the subsidiary area SA within each pixel PX to distinguish between them. For example, the emission area EMA and the subsidiary area SA in each pixel PX may be defined by the second bank 600.

The electrode layer 200 may be extended in one direction or a direction and may include a first electrode 210 and a second electrode 220 spaced apart from each other in another direction crossing or intersecting the one direction. The electrode layer 200 may transmit an electric signal applied from a circuit element layer to the light-emitting elements ED to emit light. The electrode layer 200 may also be utilized to generate an electric field used in a process of aligning the light-emitting elements ED so that they are oriented in a direction.

The first electrode 210 may be disposed on the left hand in each pixel PX when viewed from the top. The first electrode 210 may have a shape extended in the second direction DR2 when viewed from the top. The first electrode 210 may be disposed such that it passes through the emission area EMA. The first electrode 210 may be extended in the second direction DR2 when viewed from the top, and may be separated from the first electrode 210 of another pixel PX adjacent to it in the second direction DR2 at the separation region ROP of the subsidiary area SA.

The second electrode 220 may be spaced apart from the first electrode 210 in the first direction DR1. The second electrode 220 may be disposed on the right hand in each pixel PX when viewed from the top. The second electrode 220 may have a shape extended in the second direction DR2 when viewed from the top. The second electrode 220 may be disposed to pass through the emission area EMA. The second electrode 220 may be extended in the second direction DR2 when viewed from the top, and may be separated from the second electrode 220 of another pixel PX adjacent to it in the second direction DR2 at the separation region ROP of the subsidiary area SA.

The first electrode 210 and the second electrode 220 may be spaced apart from and face each other. The first electrode 210 may include an end 210S1 facing the second electrode 220, and the second electrode 220 may include an end 220S1 facing the first electrode 210. In the following description, the end 210S1 of the first electrode 210 may be on the side closer to the second electrode 220, i.e., the right end of the first electrode 210 when viewed from the top. In the following description, the end 220S1 of the second electrode 220 may be on the side closer to the first electrode 210, i.e., the left end of the second electrode 220 when viewed from the top. At the end 210S1 of the first electrode 210, first ends ED_S1 of the light-emitting elements ED to be described later may be placed, and at the end 220S1 of the second electrode 220, second ends ED_S2 of the light-emitting elements ED to be described later may be placed.

The first bank 400 may be disposed in the emission area EMA. The first bank 400 may be extended in one direction or a direction and may include a first sub-bank 410 and a second sub-bank 420 spaced apart from each other in another direction crossing or intersecting the one direction.

The first sub-bank 410 may have a shape extended in the second direction DR2 when viewed from the top. The first sub-bank 410 may be disposed to overlap the first electrode 210 in the third direction DR3. The first sub-bank 410 may be disposed to overlap a part of the first electrode 210, and may not overlap the end 210S1 of the first electrode 210. For example, the first sub-bank 410 may be disposed to expose the end 210S1 of the first electrode 210 in the emission area EMA. The first sub-bank 410 may be disposed above or below the first electrode 210, but not above or below the end 210S1 of the first electrode 210.

The second sub-bank 420 may have a shape extended in the second direction DR2 when viewed from the top. The second sub-bank 420 may be disposed to overlap the second electrode 220 in the third direction DR3. The second sub-bank 420 may be disposed to overlap a part of the second electrode 220, and may not overlap the end 220S1 of the second electrode 220. For example, the second sub-bank 420 may be disposed to expose the end 220S1 of the second electrode 210 in the emission area EMA. The second sub-bank 420 may be disposed above or below the second electrode 220, but not above or below the end 220S1 of the second electrode 220.

The first sub-bank 410 and the second sub-bank 420 may be spaced apart from each other and face each other in the first direction DR1. The first sub-bank 410 and the second sub-bank 420 may be spaced apart from each other with the end 210S1 of the first electrode 210 and the end 220S1 of the second electrode 220 interposed therebetween.

The step pattern PT may be disposed in the emission area EMA. The step pattern PT may have a shape extended in the second direction DR2 when viewed from the top. The step pattern PT may be disposed to overlap a part of the second electrode 210 in the third direction DR3. The step pattern PT may overlap at least the end 220S1 of the second electrode 220 in the third direction DR3. The step pattern PT may be disposed above or below the end 220S1 of the second electrode 220 to cover or overlap the end 220S1 of the second electrode 220.

The step pattern PT may not overlap the first electrode 210 in the third direction DR3. The step pattern PT may not be disposed on the end 210S1 of the first electrode 210. For example, the step pattern PT may be spaced apart from the first electrode 210 in the first direction DR1 when viewed from the top.

The light-emitting elements ED may be disposed between the first sub-bank 410 and the second sub-bank 420. The light-emitting element ED may have a shape extended in one direction or a direction. The direction in which the light-emitting elements ED are extended may be substantially perpendicular to the direction in which the first and second sub-banks 410 and 420 are extended. For example, the direction in which the light-emitting elements ED are extended may be parallel to the first direction DR1 that is substantially perpendicular to the second direction DR2, which is the direction in which the first sub-bank 410 and the second sub-bank 420 are extended. The length of the light-emitting elements ED in the extending direction may be smaller than the distance between the first sub-bank 410 and the second sub-bank 420.

The light-emitting elements ED may be disposed between the first electrode 210 and the second electrode 220. The direction in which the light-emitting elements ED are extended may be substantially perpendicular to the direction in which the first electrode 210 and the second electrode 220 are extended. For example, the direction in which the light-emitting elements ED are extended may be parallel to the first direction DR1 that is substantially perpendicular to the second direction DR2, which is the direction in which the first electrode 210 and the second electrode 220 are extended. It is, however, to be understood that the disclosure is not limited thereto. The light-emitting elements ED may be oriented obliquely to the direction in which the first electrode 210 and the second electrode 220 are extended.

Each of the light-emitting elements ED may include a first end ED_S1 and a second end ED_S2. The first end ED_S1 of each of the light-emitting elements ED may face one side or a side in the direction in which the light-emitting elements ED are extended, and the second end ED_S2 of each of the light-emitting elements ED may face the opposite side in the direction in which the light-emitting elements ED are extended. Each of the light-emitting elements ED may include semiconductor layers, which will be described later. The first end ED_S1 and the second end ED_S2 opposite to the first end ED_S1 may be defined based on one of the semiconductor layers.

Each of the light-emitting elements ED may be disposed such that the first end ED_S1 and the second end ED_S2 are placed on the respective electrodes. The light-emitting elements ED may be disposed between the first electrode 210 and the second electrode 220 such that the first end ED_S1 is placed on the first electrode 210 while the second end ED_S2 is placed on the second electrode 220. By way of example, the first end ED_S1 of each of the light-emitting elements ED may overlap the end 210S1 of the first electrode 210, and the second end ED_S2 of each of the light-emitting elements ED may overlap the end 220S1 of the second electrode 220 and the step pattern PT.

The contact electrodes 700 may be extended in one direction or a direction and may include a first contact electrode 710 and a second contact electrode 720 that are spaced apart from each other in another direction crossing or intersecting the one direction.

The first contact electrode 710 may be disposed on the left hand in each pixel PX when viewed from the top. The first contact electrode 710 may have a shape extended in the second direction DR2 when viewed from the top. The first contact electrode 710 may be disposed to overlap the first electrode 210 in the third direction DR3. The first contact electrode 710 may be disposed to overlap the end 210S1 of the first electrode 210.

The first contact electrode 710 may traverse the emission area EMA and may be partially disposed in the subsidiary area SA as well. The first contact electrode 710 may be electrically connected to the first electrode 210 through a first contact CT1 in the subsidiary area SA.

The first contact electrode 710 may overlap the first end ED_S1 of each of the light-emitting elements ED disposed in the emission area EMA in the third direction DR3. The first contact electrode 710 may be electrically connected to the first end ED_S1 of each of the light-emitting elements ED disposed in the emission area EMA.

The second contact electrode 720 may be spaced apart from the first contact electrode 710 in the first direction DR1. The second contact electrode 720 may be disposed on the right hand in each pixel PX when viewed from the top. The second contact electrode 720 may have a shape extended in the second direction DR2 when viewed from the top. The second contact electrode 720 may be disposed to overlap the second electrode 220 in the third direction DR3. The second contact electrode 720 may be disposed to overlap the end 220S1 of the second electrode 220 and the step pattern PT.

The second contact electrode 720 may traverse the emission area EMA and may be partially disposed in the subsidiary area SA as well. The second contact electrode 720 may be electrically connected to the second electrode 220 through a second contact CT2 in the subsidiary area SA.

The second contact electrode 720 may overlap the second end ED_S2 of each of the light-emitting elements ED disposed in the emission area EMA in the third direction DR3. The second contact electrode 720 may be electrically connected to the second end ED_S2 of each of the light-emitting elements ED disposed in the emission area EMA.

Figure 4:
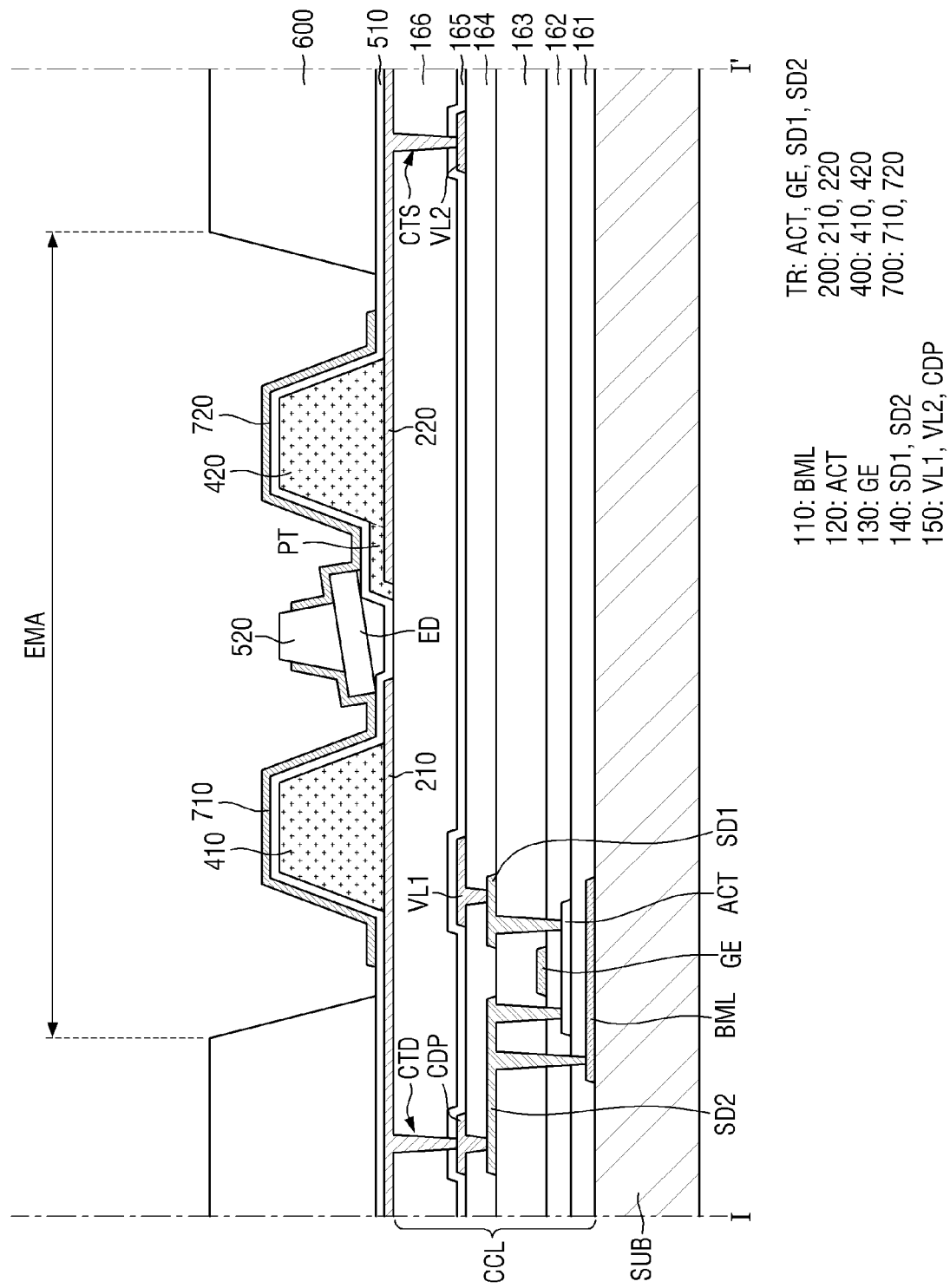
FIG. 4 is a schematic cross-sectional view showing an example, taken along line I-I' of FIG. 2.
Figure 5:
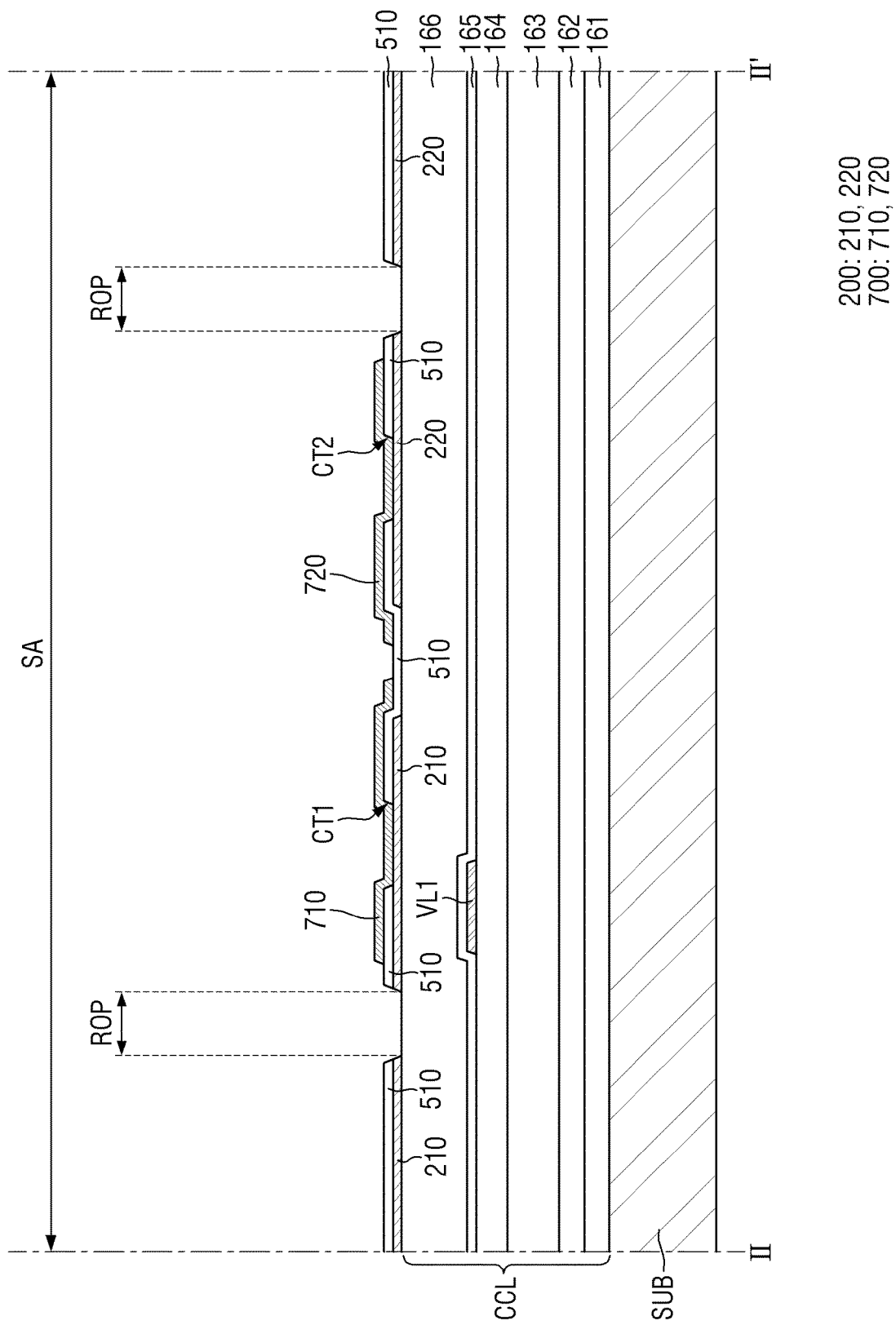
FIG. 5 is a schematic cross-sectional view showing an example, taken along line II-II' of FIG. 2.

FIG. 4 is a or intersecting cross-sectional view showing an example, taken along line I-I' of FIG. 2. FIG. 5 is a or intersecting cross-sectional view showing an example, taken along line II-II' of FIG. 2.

Referring to FIGS. 2 to 4, the display device 10 may include a substrate SUB, a circuit element layer CCL disposed on the substrate SUB, and a light-emitting element layer disposed on the circuit element layer CCL. The light-emitting element layer may include an electrode layer 200, a first bank 400, a step pattern PT, a second bank 600, light-emitting elements ED, contact electrodes 700, and insulating layers 510 and 520.

The substrate SUB may be an insulating substrate. The substrate SUB may be made of an insulating material such as glass, quartz and a polymer resin. The substrate SUB may be either a rigid substrate or a flexible substrate that can be bent, folded, or rolled.

The circuit element layer CCL may be disposed on the substrate SUB. The circuit element layer CCL may include a lower metal layer 110, a semiconductor layer 120, a first conductive layer 130, a second conductive layer 140, a third conductive layer 150 and insulating layers.

The lower metal layer 110 is disposed on the substrate SUB. The lower metal layer 110 may include a light-blocking layer BML. The light-blocking layer BML, may be disposed at least under a channel region of an active layer ACT of a transistor TR to cover or overlap it. It is, however, to be understood that the disclosure is not limited thereto. In some implementations, the light-blocking layer BML may be eliminated.

The lower metal layer 110 may include a material that blocks light. For example, the lower metal layer 110 may be made of an opaque metal material that blocks light transmission.

A buffer layer 161 may be disposed over the bottom metal layer 110. The buffer layer 161 may be disposed to cover or overlap the entire surface of the substrate SUB on which the bottom metal layer 110 is disposed. The buffer layer 161 can protect transistors from moisture permeating through the substrate SUB which is vulnerable to moisture permeation.

The semiconductor layer 120 is disposed on the buffer layer 161. The semiconductor layer 120 may include the active layer ACT of the transistor TR. The active layer ACT of the transistor TR may be disposed to overlap the light-blocking layer BML of the lower metal layer 110 as described above.

The semiconductor layer 120 may include polycrystalline silicon, monocrystalline silicon, an oxide semiconductor, etc. within the spirit and the scope of the disclosure. According to an embodiment, in case that the semiconductor layer 120 may include polycrystalline silicon, the polycrystalline silicon may be formed by crystallizing amorphous silicon. In case that the semiconductor layer 120 contains polycrystalline silicon, the active layer ACT of the transistor TR may include doped regions doped with impurities, and a channel region between them. In an embodiment, the semiconductor layer 120 may include an oxide semiconductor. For example, the oxide semiconductor may be indium-tin oxide (ITO), indium-zinc oxide (IZO), indium-gallium oxide (IGO), indium-zinc-tin oxide (IZTO), indium-gallium-zinc oxide (IGZO), indium-gallium-tin oxide (IGTO), indium-gallium-zinc-tin oxide (IGZTO), etc. within the spirit and the scope of the disclosure.

The gate insulator 162 may be disposed on the semiconductor layer 120. The gate insulator 162 may work as a gate insulating layer of each transistor. The gate insulator 162 may be made up of multiple layers in which inorganic layers including inorganic material, for example, at least one of silicon oxide ($SiO_x$), silicon nitride ($SiN_x$) and silicon oxynitride ($SiO_xN_y$) may be alternately stacked each other.

The first conductive layer 130 may be disposed on the gate insulator 162. The first conductive layer 130 may include the gate electrode GE of the transistor TR. The gate electrode GE may be disposed so that it overlaps the channel region of the active layer ACT in the thickness direction of the substrate SUB, i.e., in the third direction DR3.

A first interlayer dielectric layer 163 may be disposed on the first conductive layer 130. The first interlayer dielectric layer 163 may cover or overlap the gate electrode GE. The first interlayer dielectric layer 163 may serve as an insulating layer between the first conductive layer 130 and other layers disposed thereon and can protect the first conductive layer 130.

The second conductive layer 140 may be disposed on the first interlayer dielectric layer 163. The second conductive layer 140 may include a first electrode SD1 of the transistor TR and a second electrode SD2 of the transistor TR.

The first electrode SD1 of the transistor TR and the second electrode SD2 of the transistor TR may be electrically connected to both end regions of the active layer ACT of the transistor TR through contact holes penetrating the first interlayer dielectric layer 163 and the gate insulator 162, respectively. The second electrode SD2 of the transistor TR may be electrically connected to the light-blocking layer BML, of the lower metal layer 110 through another contact hole penetrating through the first interlayer dielectric layer 163, the gate insulator 162, and the buffer layer 161.

A second interlayer dielectric film 164 may be disposed on the second conductive layer 140. The second interlayer dielectric film 164 may be disposed to cover or overlap the first electrode SD1 of the transistor TR and the second electrode SD2 of the transistor TR. The second interlayer dielectric film 164 may serve as an insulating layer between the second conductive layer 140 and other layers disposed thereon and can protect the second conductive layer 140.

The third conductive layer 150 may be disposed on the second interlayer dielectric film 164. The third conductive layer 150 may include a first voltage line VL1, a second voltage line VL2, and a conductive pattern CDP.

The first voltage line VL1 may overlap at least a part of the first electrode SD1 of the transistor TR in the thickness direction of the substrate SUB. A high-level voltage (or first supply voltage) supplied to the transistor TR may be applied to the first voltage line VL1.

The second voltage line VL2 may be electrically connected to the second electrode 220 through a second electrode contact hole CTS penetrating through a via layer 166 and a passivation layer 165 to be described later. A low-level voltage (or second supply voltage), which is lower than the high-level voltage supplied to the first voltage line VL1, may be applied to the second voltage line VL2. By way of example, the high-level voltage (or first supply voltage) to be supplied to the transistor TR may be applied to the first voltage line VL1, and the low-level voltage (or second supply voltage) which is lower than the high-level voltage supplied to the first voltage line VL1 may be applied to the second voltage line VL2.

The conductive pattern CDP may be electrically connected to the second electrode SD2 of the transistor TR. The conductive pattern CDP may be electrically connected to the second electrode SD2 of the transistor TR through a contact hole penetrating the second interlayer dielectric film 164. The conductive pattern CDP may be electrically connected to the first electrode 210 through a first electrode contact hole CTD penetrating the via layer 166 and the passivation layer 165 to be described later. The transistor TR may transmit the first supply voltage applied from the first voltage line VL1 to the first electrode 210 through the conductive pattern CDP.

The passivation layer 165 may be disposed on the third conductive layer 150. The passivation layer 165 may be disposed to cover or overlap the third conductive layer 150. The passivation layer 165 may serve to protect the third conductive layer 150.

The buffer layer 161, the first gate insulator 162, the first interlayer dielectric layer 163, the second interlayer dielectric film 164 and the passivation layer 165 may be made up of multiple inorganic layers alternately stacked each other. For example, the buffer layer 161, the first gate insulator 162, the first interlayer dielectric layer 163, the second interlayer dielectric film 164 and the passivation layer 165 may be made up of a double layer in which inorganic layers including at least one of silicon oxide ($SiO_x$), silicon nitride ($SiN_x$) and silicon oxynitride ($SiO_xN_y$) may be stacked each other or may be made up of multiple layers in which they may be alternately stacked each other. It is, however, to be understood that the disclosure is not limited thereto. The buffer layer 161, the gate insulator 162, the first interlayer dielectric layer 163, the second interlayer dielectric film 164 and the passivation layer 165 may be made up of a single inorganic layer including the above-described insulating material.

The via layer 166 may be disposed on the passivation layer 165. The via layer 166 may include an organic insulating material, for example, an organic material such as polyimide (PI). The via layer 166 may provide a flat surface. Accordingly, the upper surface (or surface) of the via layer 166 on which the light-emitting element layer to be described later is disposed may have a generally flat surface regardless of whether there is a pattern thereunder or the shape of the pattern if any.

Hereinafter, a structure of the light-emitting element layer disposed on the circuit element layer CCL will be described with reference to FIGS. 2 to 5.

The electrode layer 200 may be disposed on the via layer 166. The electrode layer 200 may be disposed on or disposed directly on the upper surface of the via layer 166. The electrode layer 200 may be disposed on the via layer 166 and may include the first electrode 210 and the second electrode 220 spaced apart from each other. As the upper surface of the via layer 166 has a flat surface, the height of the first electrode 210 may be equal to the height of the second electrode 220. Herein, the height of each element may be measured from a reference surface such as one surface of the substrate SUB.

The first electrode 210 may be electrically connected to the conductive pattern CDP of the circuit element layer CCL through the first electrode contact hole CTD penetrating the via layer 166 and the passivation layer 165. By way of example, the first electrode 210 may be in electrical contact with the upper surface of the conductive pattern CDP exposed by the first electrode contact hole CTD. The first supply voltage applied from the first voltage line VL1 may be transmitted to the first electrode 210 through the conductive pattern CDP.

The second electrode 220 may be electrically connected to the second voltage line VL2 of the circuit element layer CCL through the second electrode contact hole CTS penetrating the via layer 166 and the passivation layer 165. By way of example, the second electrode 220 may be in electrical contact with the upper surface of the second voltage line VL2 exposed by the second electrode contact hole CTS. The second supply voltage applied from the second voltage line VL2 may be delivered to the second electrode 220.

The first electrode 210 and the second electrode 220 may be spaced apart from a first electrode 210 and a second electrode 220 of another pixel PX adjacent to the pixel PX in the second direction DR2, respectively, at the separation region ROP of the subsidiary area SA. The first electrode 210 and the second electrode 220 may expose the via layer 166 at the separating region ROP of the subsidiary area SA.

The first bank 400 may be disposed on the electrode layer 200 in the emission area EMA. The first bank 400 may be disposed on or disposed directly on the electrode layer 200. At least a part of the first bank 400 may protrude upward from the upper surface of the electrode layer 200 (for example, toward one side or a side of the third direction DR3). The protruding part of the first bank 400 may have inclined side surfaces.

As the first bank 400 may include the inclined side surfaces, the light that is emitted from the light-emitting elements ED and travels toward the side surfaces of the first bank 400 can be guided toward the upper side (for example, display side). For example, the first bank 400 may provide the space where the light-emitting elements ED are disposed and may also work as reflective partition walls or banks that changes the traveling direction of light emitted from the light-emitting elements ED toward the display side.

Although the side surfaces of the first bank 400 have an inclined linear shape or substantially inclined linear shape in the drawings, the disclosure is not limited thereto. For example, the side surfaces (or outer surfaces) of the first bank 400 may have a shape substantially of a curved semi-circle or semi-ellipse. According to an embodiment, the first bank 400 may include, but is not limited to, an organic insulating material such as polyimide (PI).

The first bank 400 may include the first sub-bank 410 disposed on the first electrode 210 and the second sub-bank 420 disposed on the second electrode 220.

The first sub-bank 410 may be disposed on the first electrode 210 and may expose at least a part of the first electrode 210. The first sub-bank 410 may be disposed on the first electrode 210 and may expose at least one end of the first electrode 210 facing the second electrode 220.

The second sub-bank 420 may be disposed on the second electrode 220 and may expose at least a part of the second electrode 220. The second sub-bank 420 may be disposed on the second electrode 220 and may expose at least one end of the second electrode 220 facing the first electrode 210.

The step pattern PT may be disposed on the second electrode 220. The step pattern PT may be disposed on one end of the second electrode 220 exposed by the second sub-bank 420. The step pattern PT may be disposed to cover or overlap the end or an end of the second electrode 220 exposed by the second sub-bank 420. The step pattern PT may be used so that the direction in which the light-emitting elements ED disposed between the first electrode 210 and the second electrode 220 is extended is oblique with respect to one surface of the substrate SUB. As the light-emitting elements ED may be arranged or disposed obliquely with respect to the surface of the substrate SUB, the light-emitting elements ED can be more readily rotated during a process of aligning the light-emitting elements ED in a direction, which will be described later.

The step pattern PT may be and the second sub-bank 420 may be integral with each other. For example, the step pattern PT may include the same material or a similar material as the second sub-bank 420 and may be formed via the same process. The step pattern PT and the second sub-bank 420 may be a single integrated pattern formed via the same process. Accordingly, the step pattern PT may include, but is not limited to, an organic insulating material such as polyimide (PI) like the first bank 400.

The first insulating layer 510 may be disposed on the first bank 400 and the step pattern PT. The first insulating layer 510 may be disposed on the electrode layer 200, the first bank 400 and the step pattern PT to cover or overlap them entirely. The first insulating layer 510 can protect the electrode layer 200, the first bank 400 and the step pattern PT and insulate the first electrode 210 and the second electrode 220 from each other.

The first insulating layer 510 may be disposed on the electrode layer 200, the first bank 400 and the step pattern PT and may include a first contact CT1 and a second contact CT2 which penetrate through the first insulating layer 510 to expose parts of the first electrode 210 and the second electrode 220, respectively. The first contact CT1 may expose a part of the upper surface of the first electrode 210, and the second contact CT2 may expose a part of the upper surface of the second electrode 220. The first contact CT1 and the second contact CT2 may be located or disposed in the subsidiary area SA. The first and second electrodes 210 and 220 may be electrically connected to the first and second contact electrodes 710 and 720 through the first contact CT1 and the second contact CT2 in the subsidiary area SA, respectively. The first insulating layer 510 may not be disposed at the separation region ROP of the subsidiary area SA.

The second bank 600 may be disposed on the first insulating layer 510. As described above, the second bank 600 may be disposed across the boundary of the pixels PX to distinguish between neighboring pixels PX, and may distinguish the emission area EMA from the subsidiary area SA. The second bank 600 has a height greater than that of the first bank 400 to distinguish between the areas. Accordingly, during an inkjet printing process for aligning the light-emitting elements ED of the process of fabricating the display device 10, it is possible to prevent that the ink in which the light-emitting elements ED is dispersed is mixed into the adjacent pixel PX, and thus the ink can be ejected into the emission area EMA.

The light-emitting elements ED may be disposed on the first insulating layer 510. The light-emitting elements ED may be disposed between the first sub-bank 410 and the second sub-bank 420. The light-emitting elements ED may be disposed such that their both ends are placed on the first electrode 210 and the second electrode 220, respectively. One ends of the light-emitting elements ED may be disposed on the first electrode 210, and the other ends of the light-emitting elements ED may be disposed on the second electrode 220 and the step pattern PT.

The second insulating layer 520 may be disposed on the light-emitting elements ED. The second insulating layer 520 may be partially disposed on the light-emitting elements ED. The second insulating layer 520 may be disposed to partially surround the outer surface of the light-emitting elements ED so that the both ends of the light-emitting elements ED are not covered or overlapped.

The part of the second insulating layer 520 which is disposed on the light-emitting elements ED may be extended in the first direction DR1 on the first insulating layer 510 when viewed from the top, thereby forming a linear or island-like pattern in each pixel PX. The second insulating layer 520 can protect the light-emitting element ED and fix the light-emitting element ED during the process of fabricating the display device 10. Although not shown in the drawings, the material forming the second insulating layer 520 may be located or disposed between the first electrode 210 and the second electrode 220, and the recessed empty space between the first insulating layer 510 and the light-emitting element ED may be filled with the material.

The contact electrodes 700 may be disposed on the second insulating layer 520. The contact electrodes 700 may include a first contact electrode 710 and a second contact electrode 720 spaced apart from each other with the second insulating layer 520 therebetween.

The first contact electrode 710 may be disposed on the first sub-bank 410. The first contact electrode 710 may be in electrical contact with the first electrode 210 and the first ends of the light-emitting elements ED. The first contact electrode 710 may be in electrical contact with the first electrode 210 exposed by the first contact CT1 penetrating through the first insulating layer 510 in the subsidiary area SA, and may be in electrical contact with the first ends of the light-emitting elements ED exposed by the second insulating layer 520 in the emission area EMA. As the first contact electrode 710 is in electrical contact with the first ends of the light-emitting elements ED and the first electrode 210, the electric signal applied to the first electrode 210 can be transmitted to the first ends of the light-emitting elements ED through the first contact electrode 710.

The second contact electrode 720 may be disposed on the second sub-bank 420. The second contact electrode 720 may also be disposed on the step pattern PT. The second contact electrode 720 may be in electrical contact with the second electrode 220 and the second ends of the light-emitting elements ED. The second contact electrode 720 may be in electrical contact with the second electrode 220 exposed by the second contact CT2 penetrating through the first insulating layer 510 in the subsidiary area SA, and may be in electrical contact with the second ends of the light-emitting elements ED exposed by the second insulating layer 520 in the emission area EMA. As the second contact electrode 720 is in electrical contact with the second ends of the light-emitting elements ED and the second electrode 220, the electric signal applied to the second electrode 220 can be transmitted to the second ends of the light-emitting elements ED through the second contact electrode 720.

Although not shown in the drawings, a third insulating layer may be further disposed on the contact electrodes 700. The third insulating layer may be entirely disposed on the substrate SUB and can protect the elements disposed on the substrate SUB from an external environment.

Figure 6:
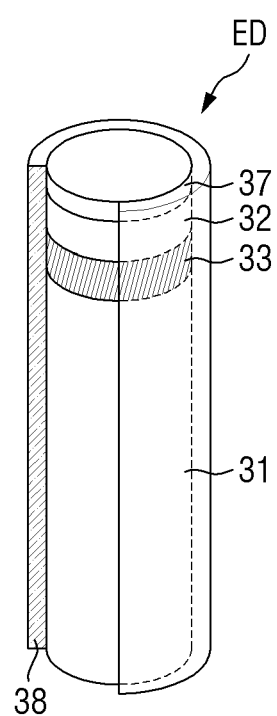
FIG. 6 is a view showing a light-emitting element according to an embodiment.

FIG. 6 is a view showing a light-emitting element according to an embodiment.

Referring to FIG. 6, the light-emitting element ED is a particulate element, and may have a rod-like or substantially cylindrical shape having an aspect ratio. The length of the light-emitting element ED may be larger than the diameter of the light-emitting element ED, and the aspect ratio may range from, but is not limited to, about 6:5 to about 100:1.

The light-emitting element ED may have a size of a nanometer scale (in a range of about 1 nm to about 1 µm) to a micrometer scale (in a range of about 1 µm to about 1 mm). According to an embodiment, both of the diameter and length of the light-emitting element ED may have nanometer scales or micrometer scales. In embodiments, the diameter of the light-emitting element ED may have a nanometer scale, while the length of the light-emitting element ED may have a micrometer scale. In an embodiment, the diameter and/or length of a part of the light-emitting elements ED may have nanometer scales, while the diameter and/or length of a part of others of the light-emitting elements ED have micrometer scales.

According to an embodiment, the light-emitting element ED may be an inorganic light-emitting diode. The inorganic light-emitting diode may include semiconductor layers. For example, the inorganic light-emitting diode may include a first conductivity type (for example, n-type) semiconductor layer, a second conductivity type (for example, p-type) semiconductor layer, and an active semiconductor layer interposed therebetween. The active semiconductor layer may receive holes and electrons from the first conductivity-type semiconductor layer and the second conductivity-type semiconductor layer, respectively, and the holes and electrons reaching the active semiconductor layer may be combined to emit light.

According to an embodiment, the above-described semiconductor layers may be sequentially stacked along the longitudinal direction of the light-emitting element ED. The light-emitting element ED may include a first semiconductor layer 31, an active layer 33 and a second semiconductor layer 32 sequentially stacked in the longitudinal direction, as shown in FIG. 6. The first semiconductor layer 31, the active layer 33 and the second semiconductor layer 32 may be a first conductivity type semiconductor layer, an active semiconductor layer, and a second conductivity type semiconductor layer described above, respectively.

The first semiconductor layer 31 may be doped with a first conductivity type dopant. The first conductivity type dopant may be Si, Ge, Sn, etc. within the spirit and the scope of the disclosure. According to an embodiment, the first semiconductor layer 31 may be n-GaN doped with n-type Si.

The second semiconductor layer 32 may be spaced apart from the first semiconductor layers 31 with the active layer 33 therebetween. The second semiconductor layer 32 may be doped with a second conductivity-type dopant such as Mg, Zn, Ca, Se and Ba. According to an embodiment, the second semiconductor layer 32 may be p-GaN doped with p-type Mg.

The active layer 33 may include a material having a single or multiple quantum well structure. As described above, the active layer 33 may emit light as electron-hole pairs are combined therein in response to an electrical signal applied through the first semiconductor layer 31 and the second semiconductor layer 32.

In an embodiment, the active layer 33 may have a structure in which a semiconductor material having a large band gap energy and a semiconductor material having a small band gap energy may be alternately stacked each other, and may include other Group III to Group V semiconductor materials depending on the wavelength range of the emitted light.

The light emitted from the active layer 33 may exit not only through the outer surfaces of the light-emitting element ED in the longitudinal direction but also through both side surfaces. For example, the directions in which the light emitted from the active layer 33 propagates are not limited to one direction or a direction.

The light-emitting element ED may further include an element electrode layer 37 disposed on the second semiconductor layer 32. The element electrode layer 37 may be in contact with the second semiconductor layer 32. The element electrode layer 37 may be an ohmic contact electrode but is not limited to it. It may be a schottky contact electrode.

In case that the both ends of the light-emitting element ED are electrically connected to the contact electrodes 700 to apply electric signals to the first and second semiconductor layers 31 and 32, the element electrode layer 37 may be disposed between the second semiconductor layer 32 and the electrode to reduce the resistance. The element electrode layer 37 may include at least one of aluminum (Al), titanium (Ti), indium (In), gold (Au), silver (Ag), indium tin oxide (ITO), indium zinc oxide (IZO) and indium tin-zinc oxide (ITZO). The element electrode layer 37 may include a semiconductor material doped with n-type or p-type impurities.

The light-emitting element ED may further include an insulating film 38 surrounding the outer peripheral surfaces of the first semiconductor layer 31, the second semiconductor layer 32, the active layer 33 and/or the element electrode layer 37. The insulating film 38 may be disposed to surround at least the outer surface of the active layer 33, and may be extended in a direction in which the light-emitting element ED is extended. The insulating film 38 can protect the above-described elements. The insulating film 38 may be made of materials having insulating properties and can prevent an electrical short-circuit that may occur in case that the active layer 33 comes in electrical contact with an electrode through which an electric signal is transmitted to the light-emitting element ED. Since the insulating film 38 may include the active layer 33 to protect the outer peripheral surfaces of the first and second semiconductor layers 31 and 32, it is possible to prevent a decrease in luminous efficiency.

Figure 7:
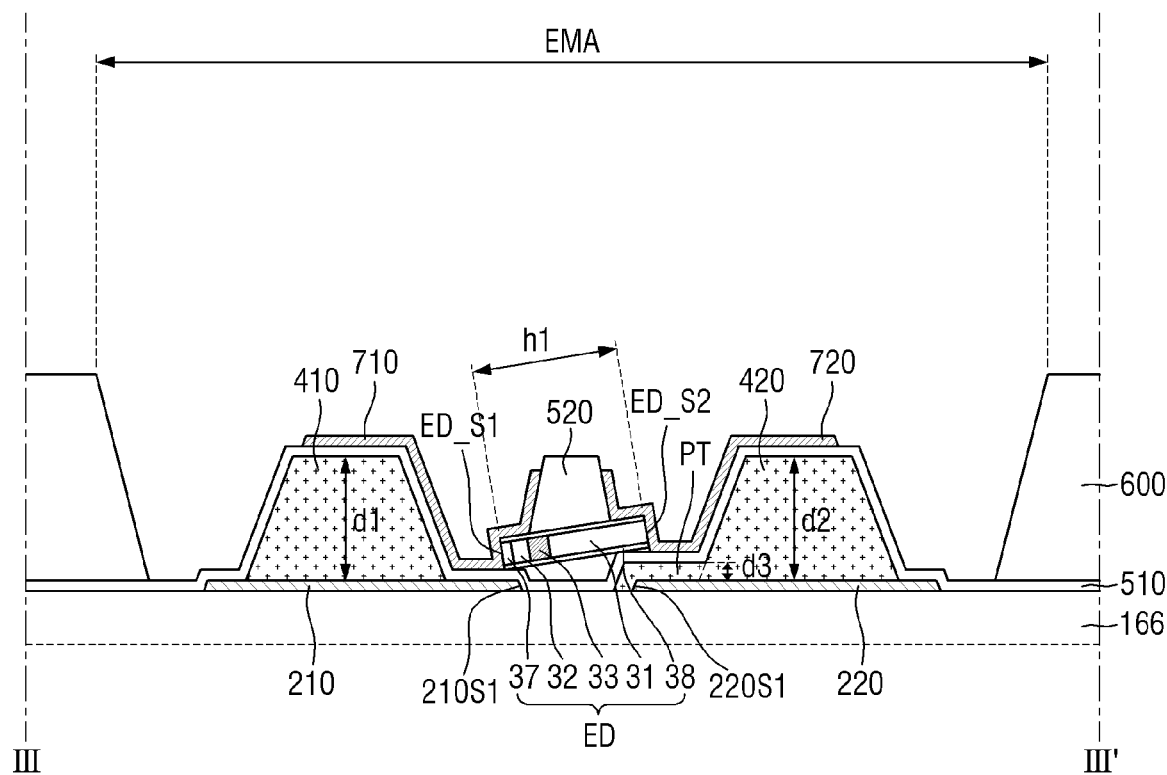
FIG. 7 is a schematic cross-sectional view showing an example, taken along line III-III' of FIG. 2.

FIG. 7 is a schematic cross-sectional view showing an example, taken along line III-III' of FIG. 2.

Referring to FIGS. 6 and 7, the first sub-bank 410 may be disposed on the first electrode 210 and may expose at least a part of the first electrode 210. By way of example, the first sub-bank 410 may be disposed on the first electrode 210 and may expose at least the end 210S1 of the first electrode 210. For example, the first sub-bank 410 may be disposed on the first electrode 210 so that the end 210S1 of the first electrode 210 facing the second electrode 220 is exposed.

The second sub-bank 420 may be disposed on the second electrode 220. According to an embodiment, the second sub-bank 420 may be integrated with the step pattern PT so that it may be formed as a single pattern. The thickness d1 of the first sub-bank 410 may be equal to the thickness d2 of the second sub-bank 420.

The step pattern PT may be disposed on the end 220S1 of the second electrode 220. The step pattern PT may include the same material or a similar material as the second sub-bank 420. The step pattern PT and the first bank 400 may be formed on the same layer. For example, the first bank 400 and the step pattern PT may be formed simultaneously via the same process.

The step pattern PT may be integrated with the second sub-bank 420 so that it is formed as a single pattern. For example, the step pattern PT and the second sub-bank 420 may be formed as a single first pattern integrated with each other via the same process. The first pattern may include a first portion having a second thickness d2 and a second portion having a third thickness d3 smaller than the second thickness d2. The first portion of the first pattern may correspond to the second sub-bank 420, and the second portion of the first pattern may correspond to the step pattern PT.

The step pattern PT may be disposed on one side or a side of the second sub-bank 420 facing the first sub-bank 410. The step pattern PT may be a protruding pattern protruding toward the first sub-bank 410 from one side surface or a side surface of the second sub-bank 420 facing the first sub-bank 410. The step pattern PT may be disposed to cover or overlap the end 220S1 of the second electrode 220 exposed by the second sub-bank 420. Accordingly, the step pattern PT may cover or overlap the upper and side surfaces of the end 220S1 of the second electrode 220.

The step pattern PT may not be disposed on the first electrode 210. The step pattern PT may be disposed between the first electrode 210 and the second electrode 220 to cover or overlap the end 220S1 of the second electrode 220 and may be spaced apart from the first electrode 210.

The step pattern PT may be formed only on one of the first electrode 210 and the second electrode 220 that are spaced apart from each other, to create a difference in height between both ends of the light-emitting elements ED. By way of example, the step pattern PT may be formed only on the end 220S1 of the second electrode 220, to create a difference in height (or a level difference) between both ends ED_S1 and ED_S2 of the light-emitting elements ED. By way of example, the step pattern PT may create a difference in height between the first end ED_S1 of the light-emitting element ED placed on the first electrode 210 and the second end ED_S2 of the light-emitting element ED placed on the second electrode 220, so that the light-emitting element ED is disposed obliquely with respect to the surface of the substrate SUB. Accordingly, the step pattern PT needs to be formed to have a thickness d3 to facilitate rotation of the light-emitting elements ED during a process of aligning the light-emitting elements ED in a direction.

By way of example, the thickness d3 of the step pattern PT may be smaller than the thickness d1 of the first sub-bank 410 and the thickness d2 of the second sub-bank 420. The thickness d3 of the step pattern PT may be smaller than a length h1 of the light-emitting element ED. Since the thickness d3 of the step pattern PT is formed to be smaller than the length h1 of the light-emitting element ED, the both ends ED_S1 and ED_S2 of the light-emitting element ED may be disposed to overlap the end 210S1 of the first electrode 210 and the end 220S1 of the second electrode 220, respectively, during the process of aligning the light-emitting elements ED. Since the thickness d3 of the step pattern PT is smaller than the length h1 of the light-emitting element ED, the light-emitting elements ED can be stably fixed on the substrate SUB after the process of aligning the light-emitting elements ED.

The light-emitting element ED may be disposed such that the direction in which it is extended is oblique to the upper surface of the substrate SUB. An angle formed between the direction in which the light-emitting element ED is extended and the upper surface of the substrate SUB may be an acute angle. The semiconductor layers included in the light-emitting element ED may be arranged or disposed sequentially along the direction inclined with respect to the upper surface of the substrate SUB at a angle. For example, the first semiconductor layer 31, the active layer 33 and the second semiconductor layer 32 of the light-emitting element ED may be arranged or disposed sequentially obliquely to the upper surface of the substrate SUB.

By way of example, the first semiconductor layer 31, the active layer 33, the second semiconductor layer 32 and the element electrode layer 37 of the light-emitting element ED may be sequentially formed obliquely to the surface of the substrate SUB in the cross section passing through the both ends.

As described above, each of the light-emitting elements ED may include the first end ED_S1 and the second end ED_S2. In the following description, the first end ED_S1 of the light-emitting element ED may be defined as one end of the light-emitting element ED at which the second semiconductor layer 32 is positioned with respect to the active layer 33, and the second end ED_S2 of the light-emitting element ED may be defined as one end of the light-emitting element ED at which the first semiconductor layer 31 is positioned with respect to the active layer 33.

The light-emitting elements ED may be arranged or disposed such that the first end ED_S1 is placed on the first electrode 210 and the second end ED_S2 is placed on the second electrode 220. It is, however, to be understood that the disclosure is not limited thereto. A part of the light-emitting diodes may be arranged or disposed such that the first end ED_S1 is placed on the second electrode 220 and the second end ED_S2 is placed on the first electrode 210. The alignment of the light-emitting elements ED may be determined according to an alignment signal applied to the electrode layer 200 during a process of aligning the light-emitting elements ED so that they are oriented in a direction, which will be described later.

The light-emitting element ED can emit light in case that a first voltage is applied to the second semiconductor layer 32 and a second voltage lower than the first voltage is applied to the first semiconductor layer 31. Accordingly, in case that the first end ED_S1 where the second semiconductor layer 32 is positioned or disposed is electrically connected to the first electrode 210 and the second end ED_S2 where the first semiconductor layer 31 is positioned or disposed is electrically connected to the second electrode 220, the light-emitting elements ED can emit light in response to an electric signal applied from the circuit element layer CCL. Therefore, the luminance of the display device 10 can be improved as the number of light-emitting elements ED having the first ends ED_S1 placed on the first electrode 210 and the second ends ED_S2 placed on the second electrode 220 increases during the process of aligning the light-emitting elements ED to be described later.

The first end ED_S1 of the light-emitting element ED may be disposed on the end 210S1 of the first electrode 210, and the second end ED_S2 of the light-emitting element ED may be disposed on the end 220S1 of the second electrode 220 and the step pattern PT. For example, the step pattern PT may be interposed between the second end ED_S2 of the light-emitting element ED and the second electrode 220.

Even though the first electrode 210 and the second electrode 220 have the same thickness on the same layer, the step pattern PT is disposed only on the second electrode 220 to cover or overlap the end 220S1 of the second electrode 220, so that the height of the first end ED_S1 of the light-emitting element ED may be different from the height of the second end ED_S2 of the light-emitting element ED. By way of example, the height or the distance of the first end ED_S1 of the light-emitting element ED and a surface of the substrate SUB may be lower than or less than the height or the distance between the second end ED_S2 of the light-emitting element ED and the surface of the substrate SUB. A difference in height between the first end ED_S1 of the light-emitting element ED and the second end ED_S2 of the light-emitting element ED may be substantially equal to the thickness d3 of the step pattern PT.

As described above, the first contact electrode 710 may be in electrical contact with the first electrode 210 in the subsidiary area SA, and may be in electrical contact with the element electrode layer 37 located or disposed at the first end ED_S1 of the light-emitting element ED in the emission area EMA. As described above, the second contact electrode 720 may be in electrical contact with the upper surface of the second electrode 220 in the subsidiary area SA, and may be in electrical contact with the first semiconductor layer 31 located or disposed at the second end ED_S2 of the light-emitting element ED in the emission area EMA.

The display device according to an embodiment image the first electrode 210, the second electrode 220, and the step pattern PT overlapping the end of the second electrode 220 facing the first electrode 210. The step pattern PT may serve to seat the light-emitting elements ED such that they are inclined with respect to the surface of the substrate SUB. During the process of aligning the light-emitting elements ED disposed between the first electrode 210 and the second electrode 220, the light-emitting elements ED may be aligned by the dielectrophoretic force generated over the first electrode 210 and the second electrode 220 so that they are oriented in a direction. During the process of aligning the light-emitting elements ED, a difference in height between both ends ED_S1 and ED_S2 of the light-emitting elements ED may be created, which is equal to the thickness d3 of the step pattern PT. Accordingly, as the light-emitting elements ED may be arranged or disposed obliquely with respect to the surface of the substrate SUB to have an inclination, the light-emitting elements ED can be more readily rotated by the same dielectrophoresis force during the process of aligning the light-emitting elements ED. In this manner, the alignment of the light-emitting elements ED can be improved during the process of aligning the light-emitting elements ED among the processes of fabricating the display device 10.

Since the step pattern PT and the first bank 400 are formed via the same process, no additional process is required to form the step pattern PT, and thus the efficiency of the process of fabricating the display device 10 can be improved. By forming the electrode layer 200 prior to forming the first bank 400 and the step pattern PT, the protruding pattern PT that protrudes from the second sub-bank 420 may be readily formed.

FIGS. 8 to 16 are views showing processing steps of a method of fabricating the display device shown in FIG. 7.

Figure 8:
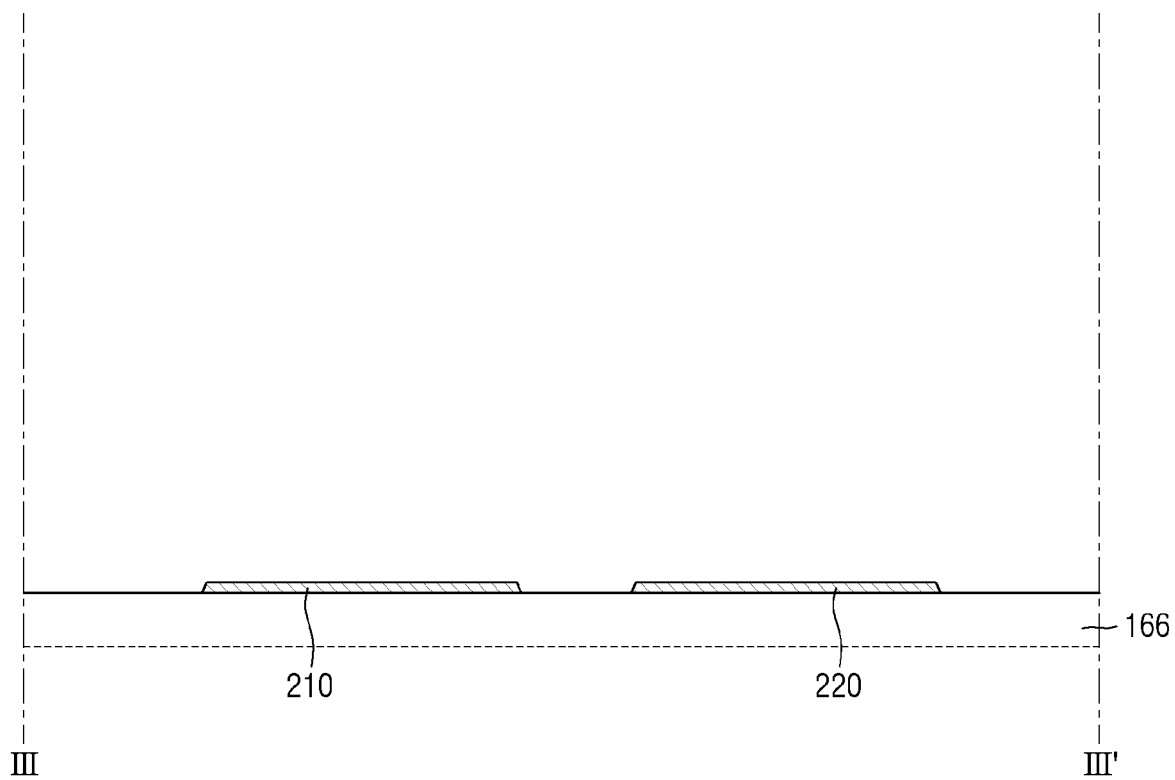
FIGS. 8 to 16 are views showing processing steps of a method of fabricating the display device shown in FIG. 7.

Referring initially to FIG. 8, a patterned electrode layer 200 is formed on the via layer 166. The patterned electrode layer 200 may include a first electrode 210 and a second electrode 220 as described above.

Figure 9:
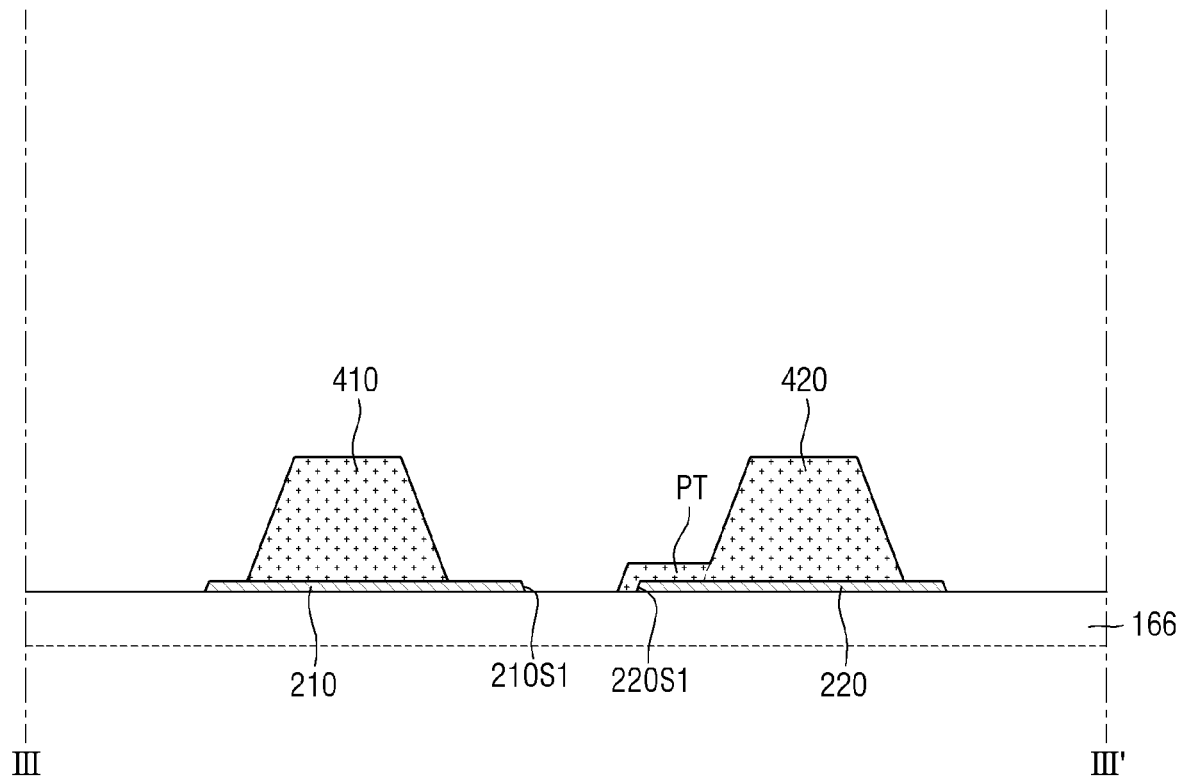

Referring to FIG. 9, the patterned first bank 400 and the step pattern PT are formed on the electrode layer 200. The first bank 400 may include a first sub-bank 410 and a second sub-bank 420. The second sub-bank 420 and the step pattern PT may be integral with each other as a single pattern. The first bank 400 and the step pattern PT may include an organic insulating material.

The forming the patterned first bank 400 and the step pattern PT may include applying an organic insulating material layer entirely over the via layer 166 on which the electrode layer 200 is formed, and removing a part of the organic insulating material layer to form the first bank 400 and the step pattern PT. The second sub-banks 420 and the step pattern PT having different thicknesses may be formed using a slit mask, a halftone mask, or a multi-tone mask.

Figure 10:
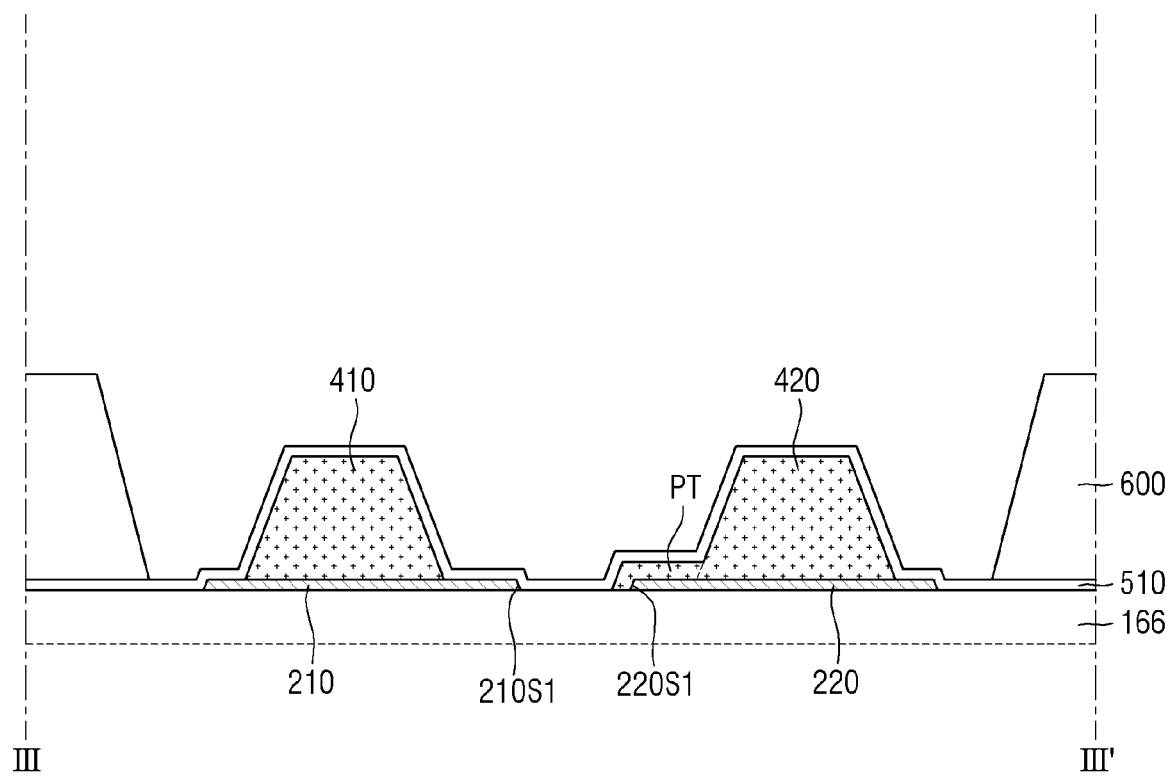

Referring to FIG. 10, a first insulating layer 510 is formed on the via layer 166 on which the patterned first bank 400 and the step pattern PT is formed, and the second bank 600 is formed.

Figure 11:
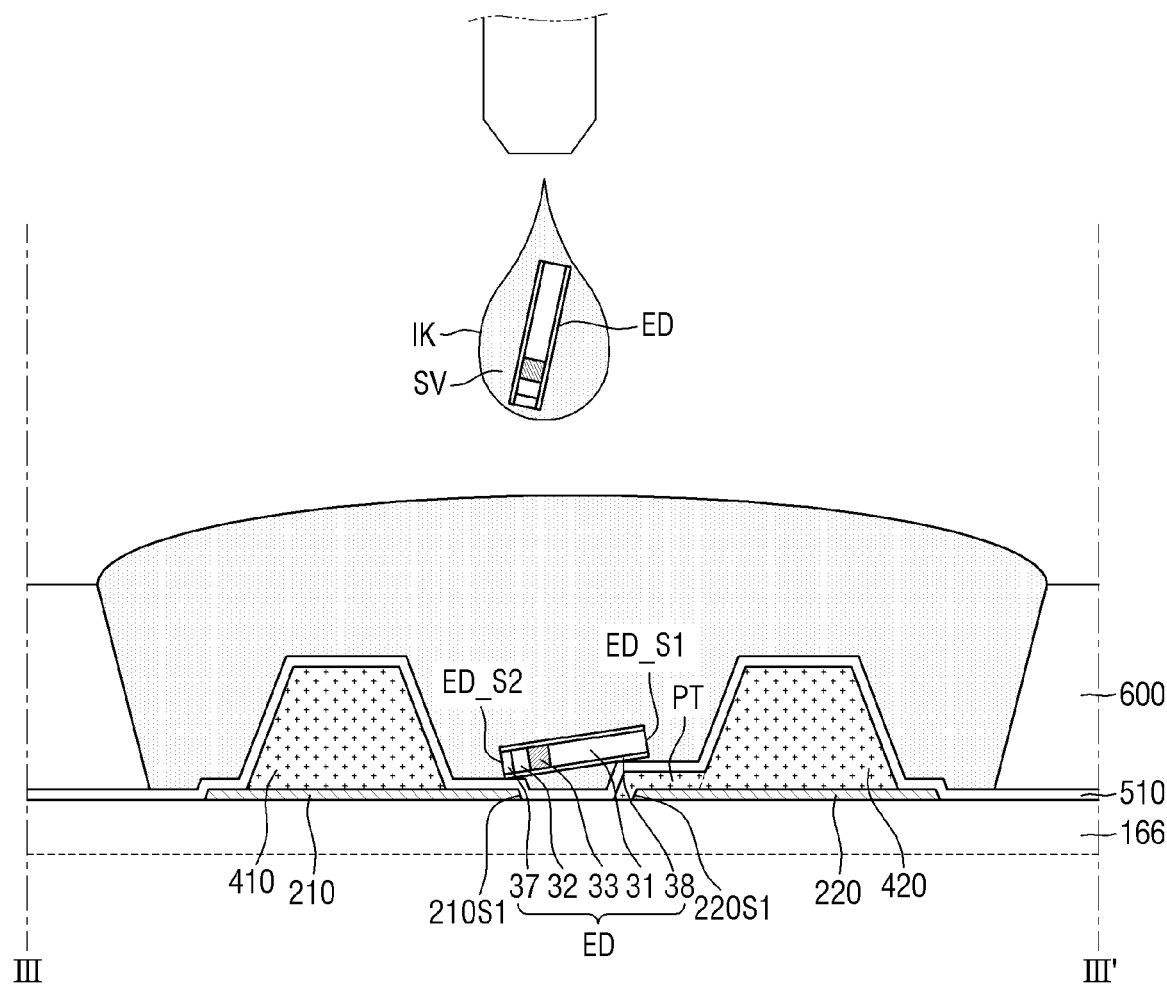
Figure 12:
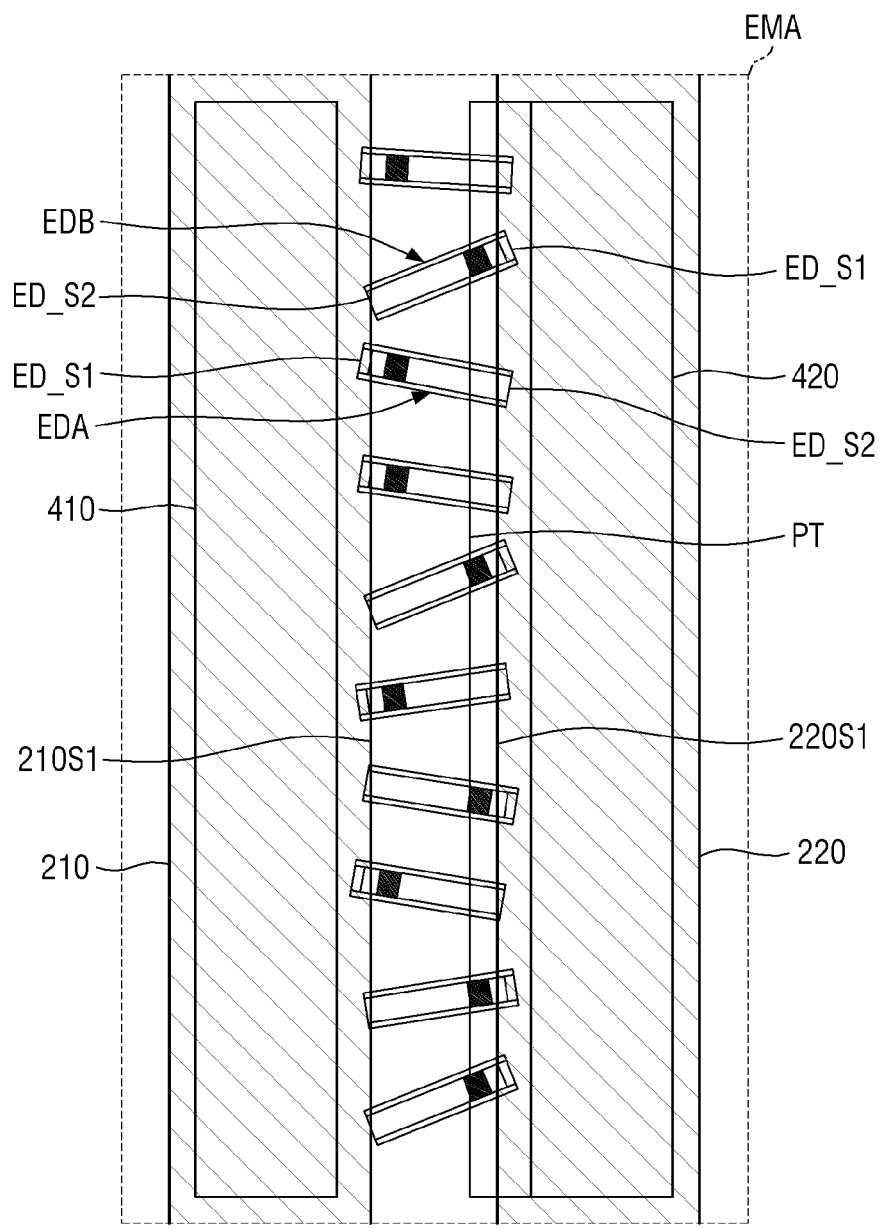

Referring to FIGS. 11 and 12, an ink IK in which the light-emitting elements ED is dispersed is ejected onto the emission area EMA using an inkjet printing process. The ink IK may include a solvent SV and light-emitting elements ED dispersed in the solvent SV. As described above, the second bank 600 can allow the ink IK to be ejected onto the emission area EMA without being mixed with the adjacent pixels PX.

In case that no alignment signal is applied to the first electrode 210 and the second electrode 220, the light-emitting elements ED may be oriented in random directions, as shown in FIG. 12. By way of example, in case that no alignment signal is applied to the first electrode 210 and the second electrode 220, the light-emitting elements ED may include first light-emitting elements EDA and second light-emitting elements EDB oriented in different directions. The first light-emitting elements EDA may have first ends ED_S1 disposed on the first electrode 210 and second ends ED_S2 disposed on the second electrode 220. The second light-emitting elements EDB may have first ends ED_S1 disposed on the second electrode 220 and second ends ED_S2 disposed on the first electrode 210.

The first ends ED_S1 of the first light-emitting elements EDA may be disposed on the end 210S1 of the first electrode 210, and the second ends ED_S2 of the first light-emitting elements EDA may be disposed on the step pattern PT disposed on the end 220S1 of the second electrode 220. The second ends ED_S2 of the second light-emitting elements EDB may be disposed on the end 210S1 of the first electrode 210, and the first ends ED_S2 of the second light-emitting elements EDB may be disposed on the step pattern PT disposed on the end 220S1 of the second electrode 220. Accordingly, the first light-emitting elements EDA and the second light-emitting elements EDB may be mounted on the substrate SUB such that the direction in which the light-emitting elements ED are extended is oblique to the surface of the substrate SUB.

Figure 13:
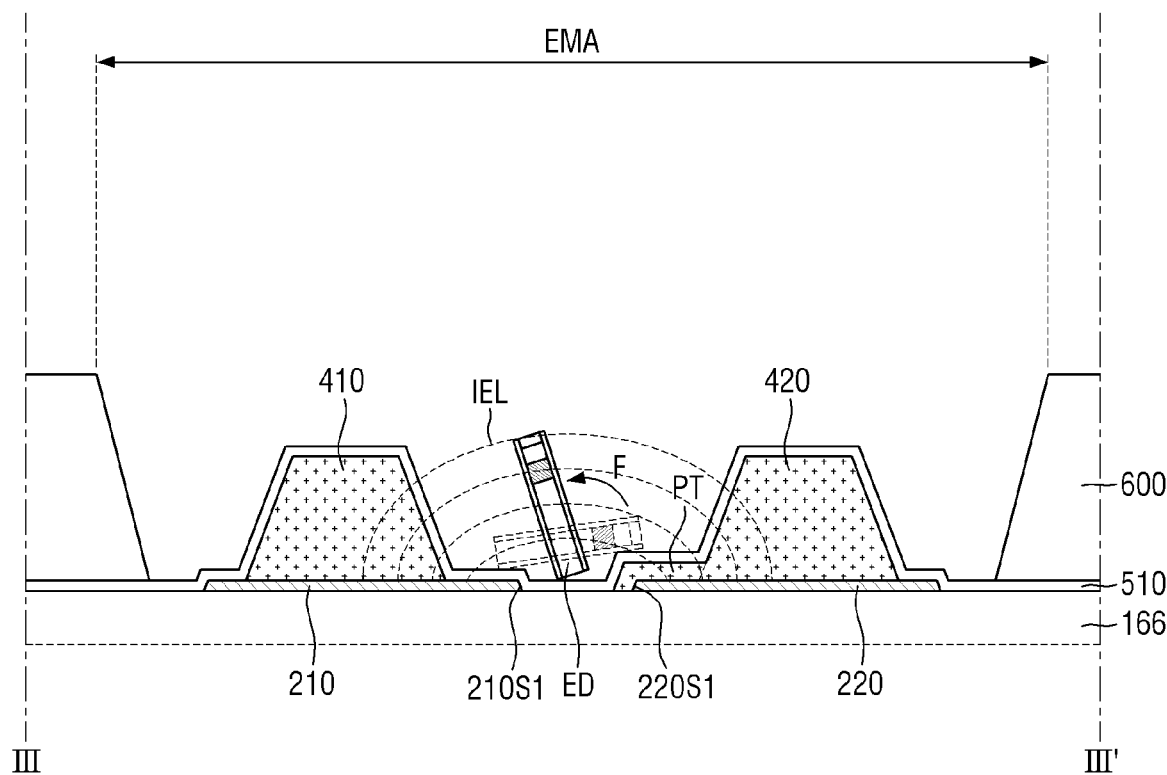
Figure 14:
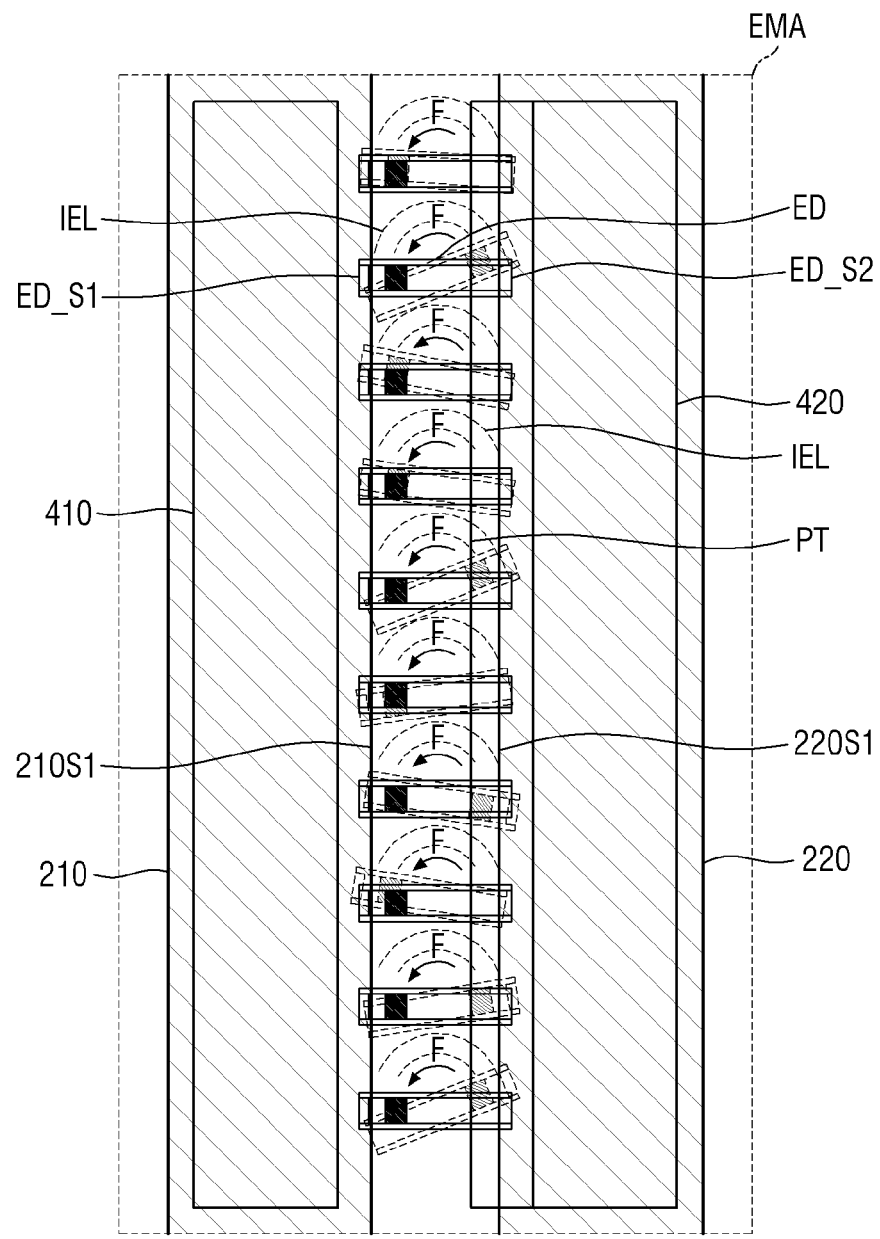
Figure 15:
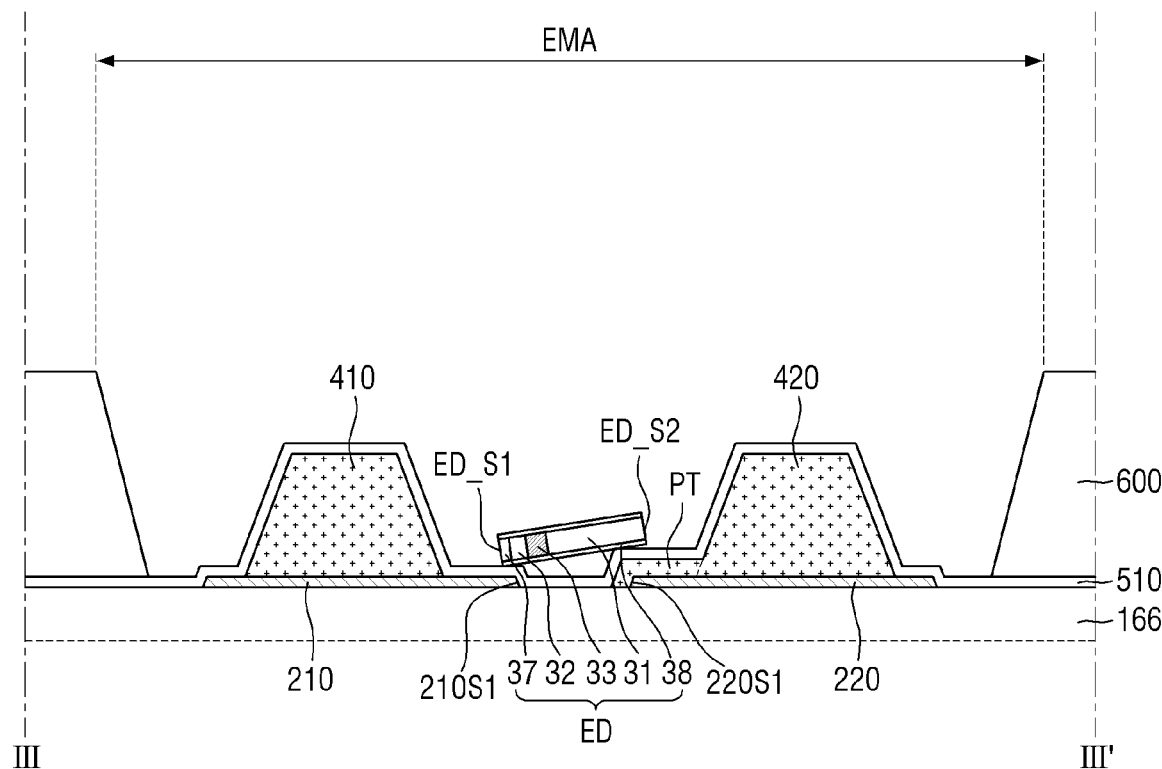

Referring to FIGS. 13 to 15, an alignment signal is applied to each of the first electrode 210 and the second electrode 220 to align the light-emitting elements ED in a direction. The process of aligning the light-emitting elements ED in a direction may refer to a process of aligning the light-emitting elements ED so that their ends may be oriented in the same direction. By way of example, in case that alignment signals are applied to the first electrode 210 and the second electrode 220, an electric field IEL may be formed between the first electrode 210 and the second electrode 220. A dielectrophoretic force F by the electric field IEL may act on the light-emitting elements ED. As the orientation and position of the light-emitting elements ED are changed by the dielectrophoretic force F, the first ends ED_S1 of the light-emitting elements ED may be disposed on the first electrode 210 while the second ends ED_S2 of the light-emitting elements ED may be disposed on the second electrode 220 as shown in FIG. 15.

As shown in FIG. 13, the light-emitting elements ED may be aligned as they are rotated in a horizontal direction and a vertical direction by the dielectrophoretic force F. According to this embodiment, since the heights of both ends ED_S1 and ED_S2 of the light-emitting elements ED are different by the step pattern PT prior to the process of aligning the light-emitting elements ED in a direction, the light-emitting elements ED may have a physical directivity with respect to the surface of the substrate SUB. Therefore, since the light-emitting elements ED can be rotated readily for the same dielectrophoretic force F, the degree of alignment can be improved in case that the electric field signal for the alignment process is applied with the same voltage. Even in case that the electric field signal for the alignment process is applied with a low voltage, the same degree of alignment can be achieved.

Figure 16:
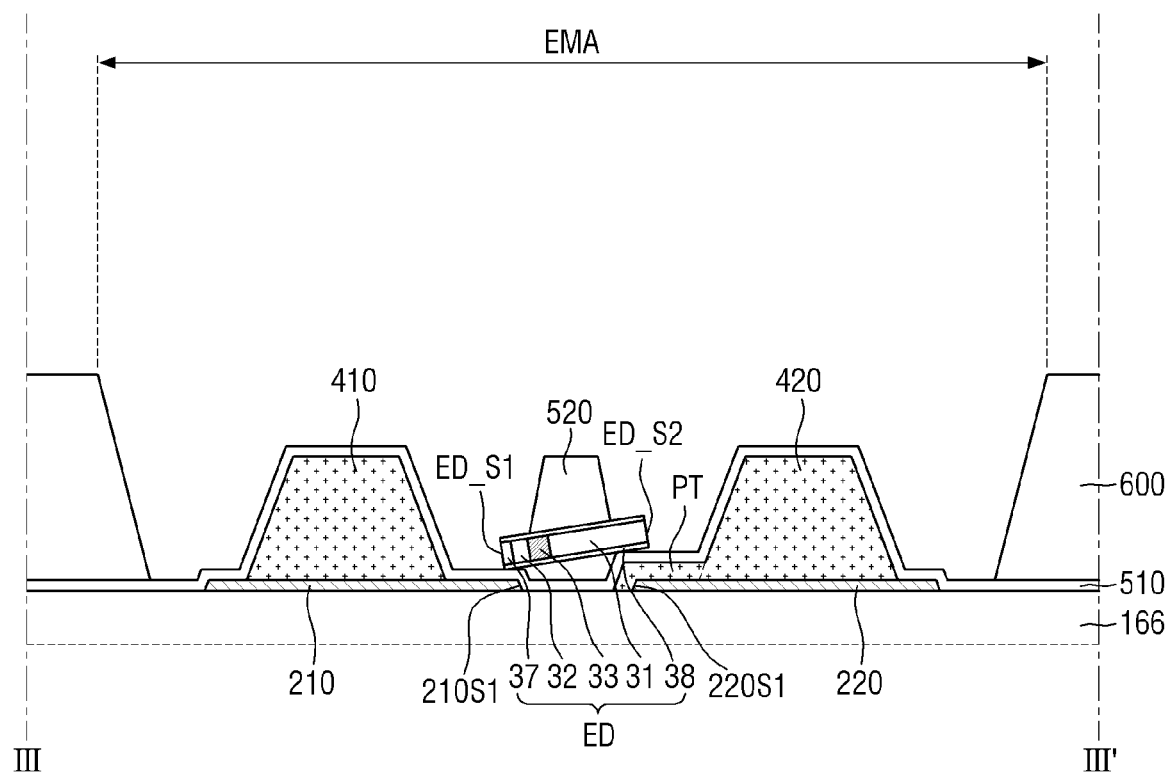

Referring to FIG. 16, a second insulating layer 520 exposing both ends of the light-emitting elements ED may be formed. The second insulating layer 520 exposing the both ends of the light-emitting elements ED may be formed by forming an insulating material layer entirely on the substrate SUB to remove a part of the insulating material layer.

Hereinafter, the light-emitting element layers of the display device 10 according to other embodiments will be described. In the following description, the same or similar elements will be denoted by the same or similar reference numerals, and redundant descriptions will be omitted or briefly described. Descriptions will focus on differences from the above embodiment.

Figure 17:
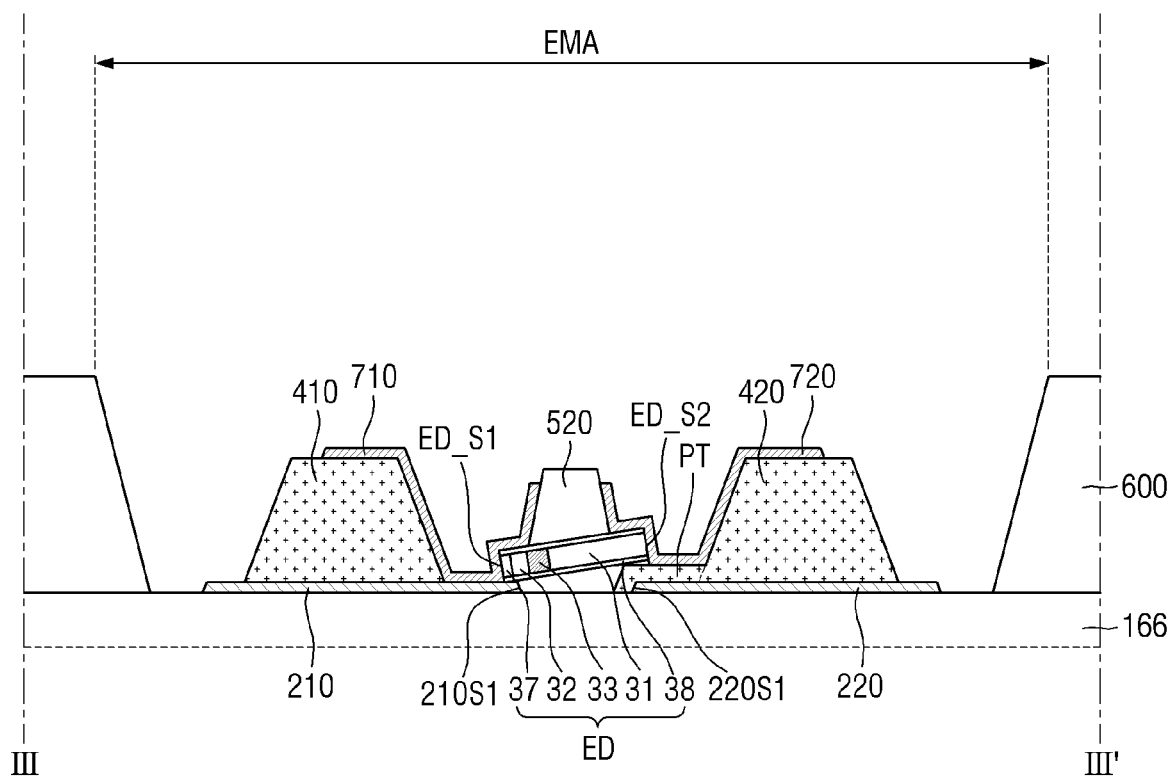
FIG. 17 is a schematic cross-sectional view showing another example, taken along line III-III' of FIG. 2.

FIG. 17 is a schematic cross-sectional view showing another example, taken along line III-III' of FIG. 2.

An embodiment of FIG. 17 may be different from an embodiment of FIG. 7 in that the first insulating layer 510 disposed to cover or overlap the first bank 400 and the step pattern PT is eliminated from a display device 10. The following description will focus on the difference and the redundant description will be omitted.

By way of example, a light-emitting element ED may be disposed such that both ends ED_S1 and ED_S2 thereof are disposed on the first electrode 210 and the second electrode 220, respectively. The first end ED_S1 of the light-emitting element ED may be disposed on the end 210S1 of the first electrode 210, and the second end ED_S2 of the light-emitting element ED may be disposed on or disposed directly on the step pattern PT covering or overlapping the end 220S1 of the second electrode 220.

The second bank 600 may be disposed on or directly disposed on the upper surface of the via layer 166.

The first contact electrode 710 may be in contact with the first sub-bank 410 and a part of the first electrode 210 exposed by the light-emitting element ED in the emission area EMA. The first contact electrode 710 may be in electrical contact with the first end ED_S1 of the light-emitting element ED. For example, the first contact electrode 710 may be in electrical contact with a part of the first electrode 210 and the first end ED_S1 of the light-emitting element ED in the emission area EMA.

The second contact electrode 720 may be in contact with the step pattern PT disposed on the end 220S1 of the second electrode 220. The second contact electrode 720 may be in electrical contact with the second end ED_S2 of the light-emitting element ED. Since the step pattern PT is disposed to cover or overlap the end 220S1 of the second electrode 220 adjacent to the second end ED_S2 of the light-emitting element ED, the second contact electrode 720 and the second electrode 220 may not be in electrical contact with each other in a region where the light-emitting element ED is disposed in the emission area EMA. Although not shown in the drawings, the second contact electrode 720 may be in electrical contact with a part of the second electrode 220 exposed by the second sub-bank 420 in a region not adjacent to the light-emitting element ED in the emission area EMA, or may be in electrical contact with the second electrode 220 in the subsidiary area SA.

According to this embodiment, for example, even though the first insulating layer 510 disposed on the first bank 400 and the step pattern PT is eliminated, the step pattern PT is disposed to cover or overlap the end 220S1 of the second electrode 220 facing the first electrode 210, and thus the first electrode 210 and the second electrode 220 can be electrically insulated from each other. Accordingly, since the process of forming the first insulating layer 510 can be omitted from the processes of fabricating the display device 10, and thus the cost of fabricating the display device 10 can be saved. A process for forming contacts CT1 and CT2 (see FIG. 2) penetrating through the first insulating layer 510 may be omitted from the process of fabricating the display device 10, so that the efficiency of the process of fabricating the display device 10 can be improved.

Figure 18:
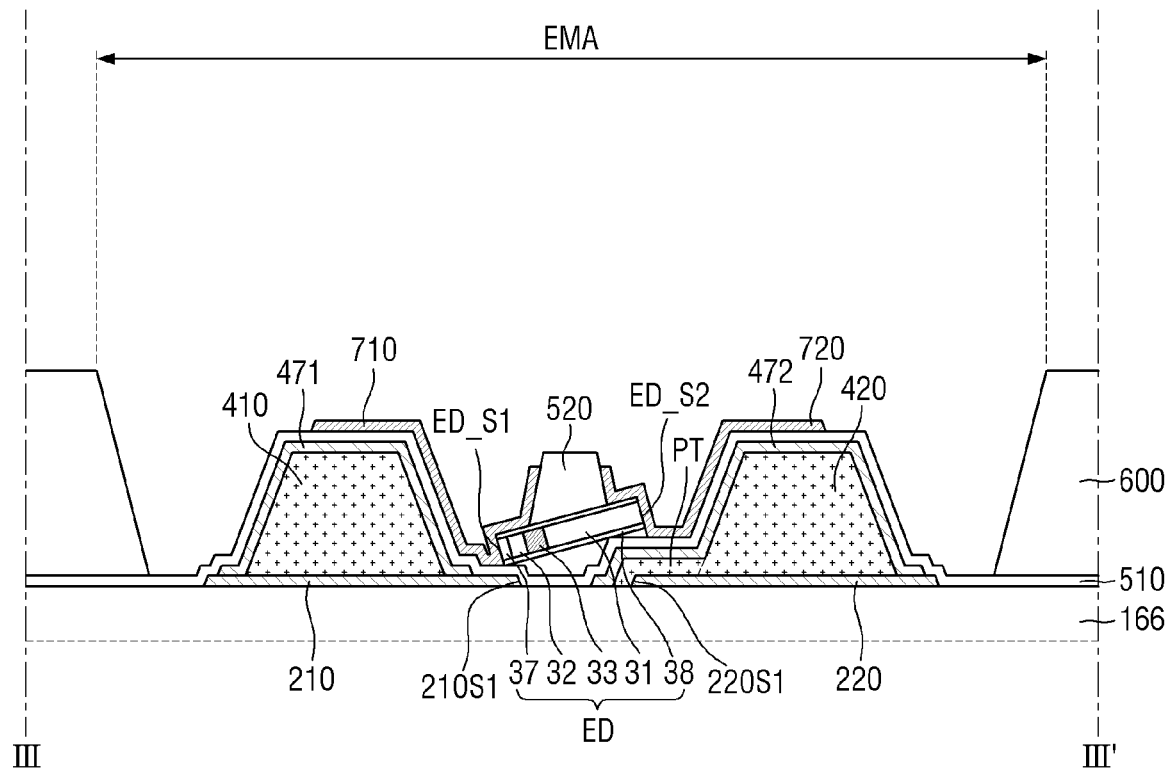
FIG. 18 is a schematic cross-sectional view showing another example, taken along line III-III' of FIG. 2.

FIG. 18 is a schematic cross-sectional view showing another example, taken along line III-III' of FIG. 2.

An embodiment of FIG. 18 may be different from an embodiment of FIG. 7 in that a display device 10 further may include a reflective layer 470 disposed on a first bank 400 and a step pattern PT. The following description will focus on the difference and the redundant description will be omitted.

By way of example, the display device 10 according to this embodiment may further include the reflective layer 470. The reflective layer 470 may be disposed on the first bank 400 and the step pattern PT in the emission area EMA. The reflective layer 470 may be disposed to cover or overlap the outer surfaces of the first bank 400 and the step pattern PT. The reflective layer 470 disposed to cover or overlap the outer surfaces of the first bank 400 and the step pattern PT can change the traveling direction of the light that is emitted from the both ends ED_S1 and ED_S2 of the light-emitting element ED and is incident on the first bank 400 and the step pattern PT toward the display side, i.e., the upper side of the display device 10.

The reflective layer 470 may include a reflective material. The reflective layer 470 may be made of, for example, silver (Ag), copper (Cu), aluminum (Al), nickel (Ni), lanthanum (La) or an alloy thereof, or a material including metal such as indium tin oxide (ITO), indium zinc oxide (IZO) and indium tin-zinc oxide (ITZO). It is, however, to be understood that the disclosure is not limited thereto.

The reflective layer 470 may include a first reflective pattern 471 and a second reflective pattern 472 spaced apart from each other.

The first reflective pattern 471 may be disposed on the first sub-bank 410. The first reflective pattern 471 may be disposed to cover or overlap the outer surface of the first sub-bank 410. The first reflective pattern 471 may have a shape conforming to the slope of the first sub-bank 410 or substantially conforming to the slope of the first sub-bank 410.

The second reflective pattern 472 may be disposed on the second sub-bank 420 and the step pattern PT. The second reflective pattern 472 may be disposed to cover or overlap the outer surfaces of the second sub-bank 420 and the step pattern PT. The second reflective pattern 472 may have a shape conforming to the slope of the second sub-bank 420 and the step pattern PT or substantially conforming to the slope of the second sub-bank 420 and the step pattern PT.

The first reflective pattern 471 and the second reflective pattern 472 may be spaced apart from each other with the light-emitting elements ED interposed therebetween. For example, the first reflective pattern 471 and the second reflective pattern 472 may be spaced apart from each other in the second direction DR2.

The first insulating layer 510 may be disposed on the reflective layer 470. The first insulating layer 510 may be disposed to cover or overlap the first reflective pattern 471 and the second reflective pattern 472 and may insulate the first reflective pattern 471 and the second reflective pattern 472 from each other.

According to this embodiment, the display device 10 further may include the reflective layer 470 disposed on the first bank 400 and the step pattern PT, the light is emitted from the both ends ED_S1 and ED_S2 of the light-emitting element ED is reflected by the reflective layer 470 toward the display side, i.e., the upper side DR3 of the display device 10. As a result, the emission efficiency of the display device 10 can be improved.

Figure 19:
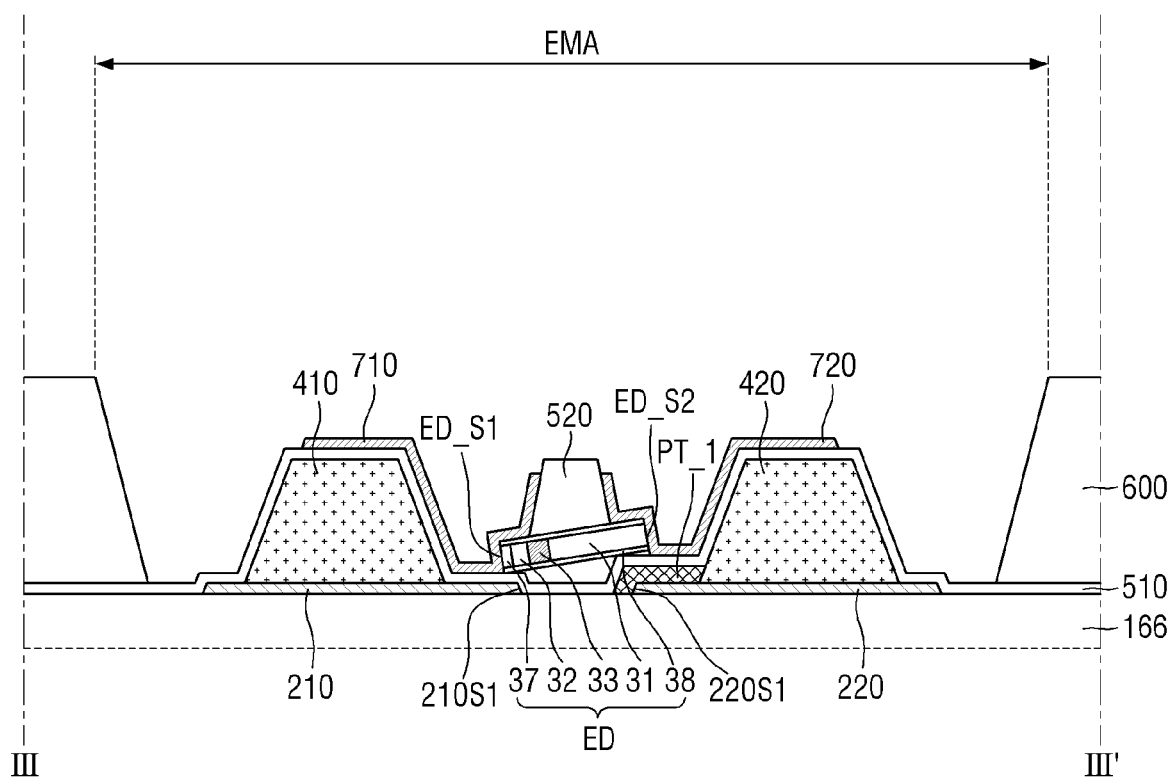
FIG. 19 is a schematic cross-sectional view showing another example, taken along line III-III' of FIG. 2.

FIG. 19 is a schematic cross-sectional view showing another example, taken along line III-III' of FIG. 2.

An embodiment of FIG. 19 may be different from an embodiment of FIG. 7 in that a step pattern PT_1 is formed as a different layer from a first bank 400 and is disposed on the first bank 400 in a display device 10. The following description will focus on the difference and the redundant description will be omitted.

By way of example, the step pattern PT_1 may be formed as a different layer from the first bank 400. According to this embodiment, the step pattern PT_1 may be formed via an additional process after the first bank 400 has been formed.

According to this embodiment, the second sub-bank 420 may expose at least a part of the second electrode 220. By way of example, the second sub-bank 420 may be disposed on the second electrode 220 and may expose at least the end 220S1 of the second electrode 220. For example, the second sub-bank 420 may be disposed on the second electrode 220 so that the end 220S1 of the second electrode 220 facing the first electrode 210 is exposed.

As described above, the step pattern PT_1 may be disposed on the end 220S1 of the second electrode 220 exposed by the second sub-bank 420, to cover or overlap the end 220S1 of the second electrode 220. The step pattern PT_1 may be disposed such that it is in contact with the side surface of the second sub-bank 420 facing the first sub-bank 410. One side surface or a side surface of the step pattern PT_1 may be disposed on the side surface of the second sub-bank 420 facing the first sub-bank 410.

In an embodiment, the step pattern PT_1 may include a material different from the material included in the second sub-bank 420. For example, in an embodiment in which the second sub-bank 420 may include an organic insulating material, the step pattern PT_1 may include an inorganic insulating material or an organic insulating material. In embodiments, the step pattern PT_1 may include the same material as the material included in the second sub-bank 420 or a similar material, but may be formed as a different layer via an additional process.

According to this embodiment, the step pattern PT_1 is formed via an additional process after the process of forming the first bank 400, and thus the efficiency of the fabrication process may be lowered. However, there is an advantage in that an adjustment of the thickness of the step pattern PT_1 which may be different from the thickness of the first bank 400 may be readily achieved.

Figure 20:
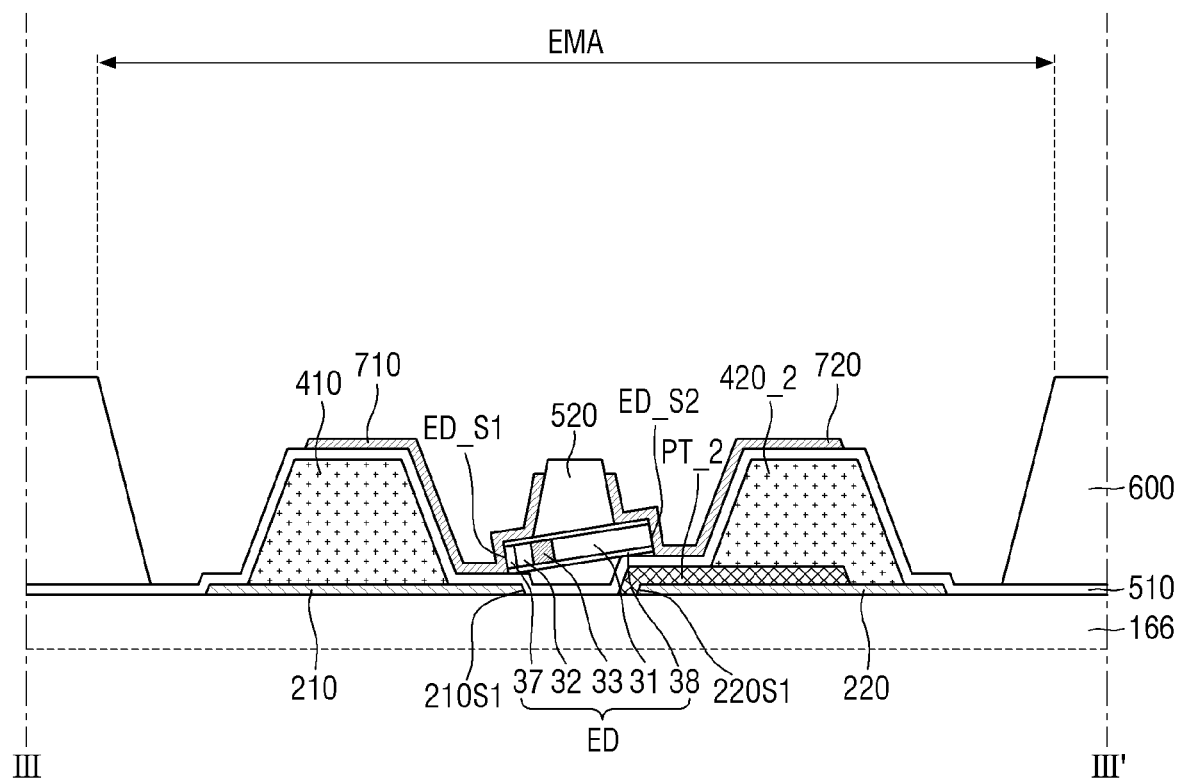
FIG. 20 is a cross-sectional view showing another example, taken along line III-III' of FIG. 2.

FIG. 20 is a schematic cross-sectional view showing another example, taken along line III-III' of FIG. 2.

An embodiment of FIG. 20 may be different from an embodiment of FIG. 19 in that a step pattern PT_2 is formed as a different layer from a first bank 400_2 and a second sub-bank 420_2 is disposed on the step pattern PT_2. The following description will focus on the difference and the redundant description will be omitted.

By way of example, the step pattern PT_2 may be formed as a different layer from the first bank 400_2. According to this embodiment, the first bank 400_2 may be formed via an additional process after the step pattern PT_2 has been formed.

The step pattern PT_2 may be disposed on the second electrode 220. The step pattern PT_2 may be disposed to cover or overlap at least the end 220S1 of the second electrode 220 facing the first electrode 210. The step pattern PT_2 may be extended from the end 220S1 of the second electrode 220 and may be partially disposed at a central part of the second electrode 220. The step pattern PT_2 may include an inorganic insulating material or an organic insulating material.

The first bank 400_2 may be disposed over the electrode layer 200 on which the step pattern PT_2 is formed. By way of example, the first sub-bank 410 may be disposed on the first electrode 210, and the second sub-bank 420_2 may be disposed on the second electrode 220 and the step pattern PT_2. The second sub-bank 420_2 may be disposed to expose a part of the step pattern PT_2 disposed on the end 220S1 of the second electrode 220. The second sub-bank 420_2 may be disposed to cover or overlap another part of the step pattern PT_2 disposed at the central part of the second electrode 220.

In an embodiment, the step pattern PT_2 may include a material different from the material included in the second sub-bank 420_2. For example, in an embodiment in which the second sub-bank 420_2 may include an organic insulating material, the step pattern PT_2 may include an inorganic insulating material or an organic insulating material. In other embodiments, the step pattern PT_2 may include the same material as the material included in the second sub-bank 420_2 or a similar material, but may be formed as a different layer via an additional process.

According to this embodiment, the first bank 400_2 is formed via an additional process after the step pattern PT_2 has been formed, and thus the efficiency of the fabrication process may be lowered. However, since the step pattern PT_2 is formed prior to the first bank 400_2, a region may be readily designed where the step pattern PT_2 is formed. Since the step pattern PT_2 and the first bank 400_2 are formed via an additional process, there is an advantage in that an adjustment of the thickness of the step pattern PT_2 which may be different from the thickness of the first bank 400_2 may be readily achieved.

Figure 21:
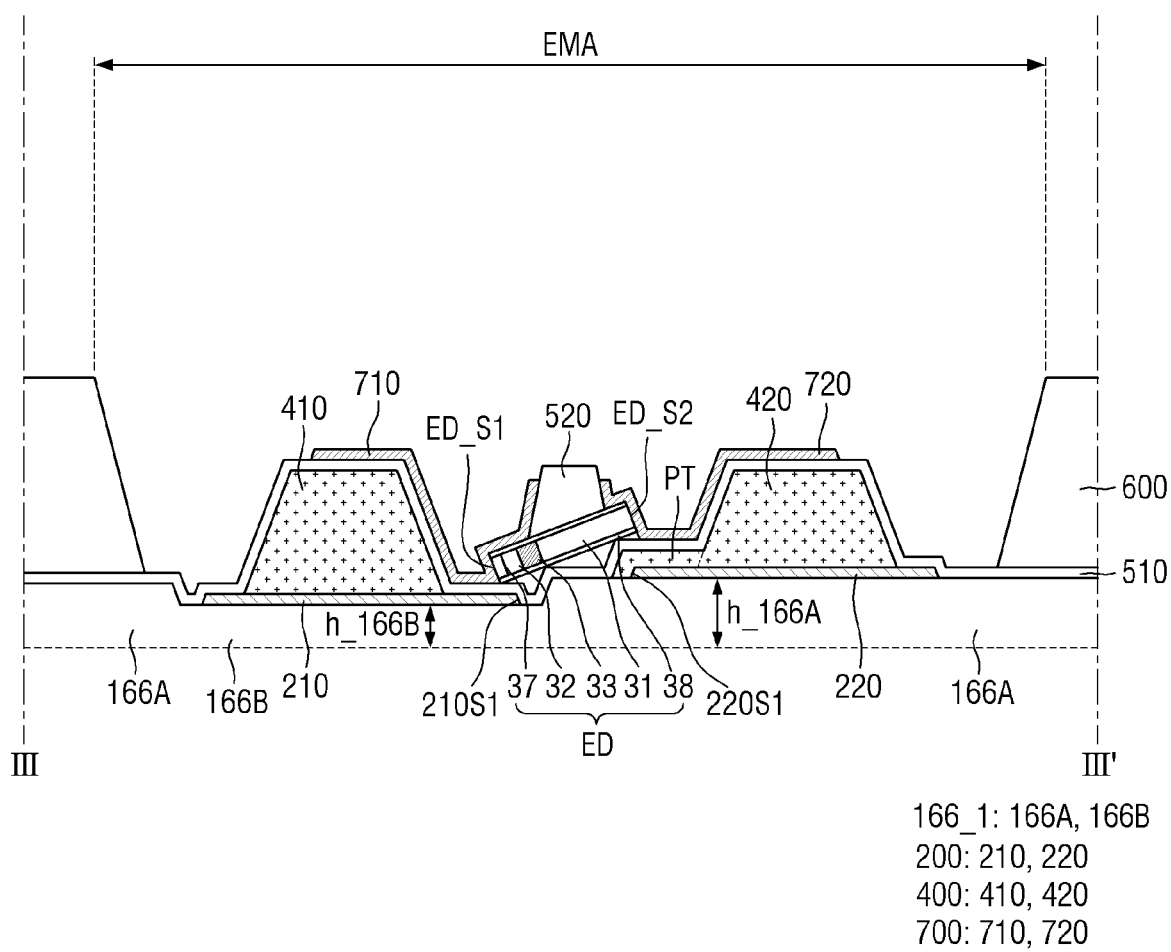
FIG. 21 is a schematic cross-sectional view showing another example, taken along line III-III' of FIG. 2.

FIG. 21 is a schematic cross-sectional view showing another example, taken along line III-III' of FIG. 2.

An embodiment of FIG. 21 may be different from an embodiment of FIG. 7 in that a via layer 166_1 on which a display element layer is disposed in a display device 10 may include a first region 166A and a second region 166B having different heights or thicknesses. The following description will focus on the difference and the redundant description will be omitted.

By way of example, the via layer 166_1 may include a step. The via layer 166_1 may include a step structure, i.e., different regions have different heights. The via layer 166_1 may include a first region 166A having a first height h_166A and a second region 166B having a second height h_166B lower than the first height h_166A. Although not shown in the drawings, the heights h_166A and h_166B of the via layer 166_1 may be measured from the reference plane such as one surface of the substrate SUB. The via layer 166_1 may have a generally flat surface in each of the regions of the via layer 166_1 regardless of whether there is a pattern thereunder and the shape of the pattern if any. At the boundary between the different regions, the via layer 166_1 may have a step structure.

The second region 166B of the via layer 166_1 may be disposed in the emission area EMA. The second region 166B of the via layer 166_1 may overlap the first electrode 210 and the first sub-bank 410 in the third direction DR3 in the emission area EMA. The second region 166B of the via layer 166_1 may not overlap the second electrode 220, the second sub-bank 420 and the step pattern PT in the third direction DR3 in the emission area EMA. The second region 166B of the via layer 166_1 may overlap the first electrode 210 and the first sub-bank 410 to form a depression in a stripe shape or substantially stripe shape in the emission area EMA.

The first electrode 210 may be disposed on the second region 166B of the via layer 166_1. The first electrode 210 may be disposed on or directly disposed on the upper surface of the second region 166B of the via layer 166_1.

The second electrode 220 may be disposed on the first region 166A of the via layer 166_1. The second electrode 220 may be disposed on or disposed directly on the upper surface of the first region 166A of the via layer 166_1. The second electrode 220 may be spaced apart from the first electrode 210.

As the via layer 166_1 on which the electrode layer 200 is disposed has the step structure, the height of the first electrode 210 of the electrode layer 200 may be different from the height of the second electrode 220 of the electrode layer 200. By way of example, since the first electrode 210 is disposed on the second region 166B of the via layer 166_1 and the second electrode 220 is disposed on the first region 166A of the via layer 166_1, the height of the first electrode 210 may be different from the height of the second electrode 220 from the surface of the substrate SUB. For example, the height of the first electrode 210 disposed on the second region 166B of the via layer 166_1 having the second height h_166B may be lower than the height of the second electrode 220 disposed on the first region 166A of the via layer 166_1 having the first height h_166A.

The first bank 400 and the step pattern PT may be disposed on the electrode layer 200. By way of example, the first sub-bank 410 may overlap the second region 166B of the via layer 166_1, and the second sub-bank 420 may overlap the first region 166A of the via layer 166_1. The step pattern PT may be disposed on the first region 166A of the via layer 166_1.

The first insulating layer 510 may be disposed on the first bank 400 and the step pattern PT. The first insulating layer 510 may have a surface shape reflecting level differences by the elements and patterns disposed thereunder.

The light-emitting element ED may be disposed between the first electrode 210 and the second electrode 220 such that a first end ED_S1 is placed on the end 210S1 of the first electrode 210 and a second end ED_S2 is placed on the end 220S1 of the second electrode 220. The first end ED_S1 of the light-emitting element ED may overlap the second region 166B of the via layer 166_1, and the second end ED_S2 of the light-emitting element ED may overlap the first region 166A of the via layer 166_1.

According to this embodiment, the both ends ED_S1 and ED_S2 of the light-emitting element ED are disposed on the first region 166A of the via layer 166_1 and the second region 166B of the via layer 166_1, respectively, which have different heights. Accordingly, the inclination of the direction in which the light-emitting element ED is extended with respect to the surface of the substrate SUB can be further increased compared to an embodiment where only the step pattern PT is disposed. In other words, as the via layer 166_1 has the step structure, a difference between the height of the first end ED_S1 of the light-emitting element ED and the height of the second end ED_S2 of the light-emitting element ED from the surface of the substrate SUB can become larger. Accordingly, as the light-emitting elements ED may be arranged or disposed obliquely with respect to the surface of the substrate SUB to have a larger inclination, the light-emitting elements ED can be more readily rotated by the same dielectrophoresis force during the process of aligning the light-emitting elements ED. For example, the step structure of the via layer 166_1 can assist the step pattern PT so that the light-emitting elements ED are aligned obliquely with respect to the surface of the substrate SUB. In this manner, the alignment of the light-emitting elements ED can be improved during the process of aligning the light-emitting elements ED among the processes of fabricating the display device 10.

Figure 22:
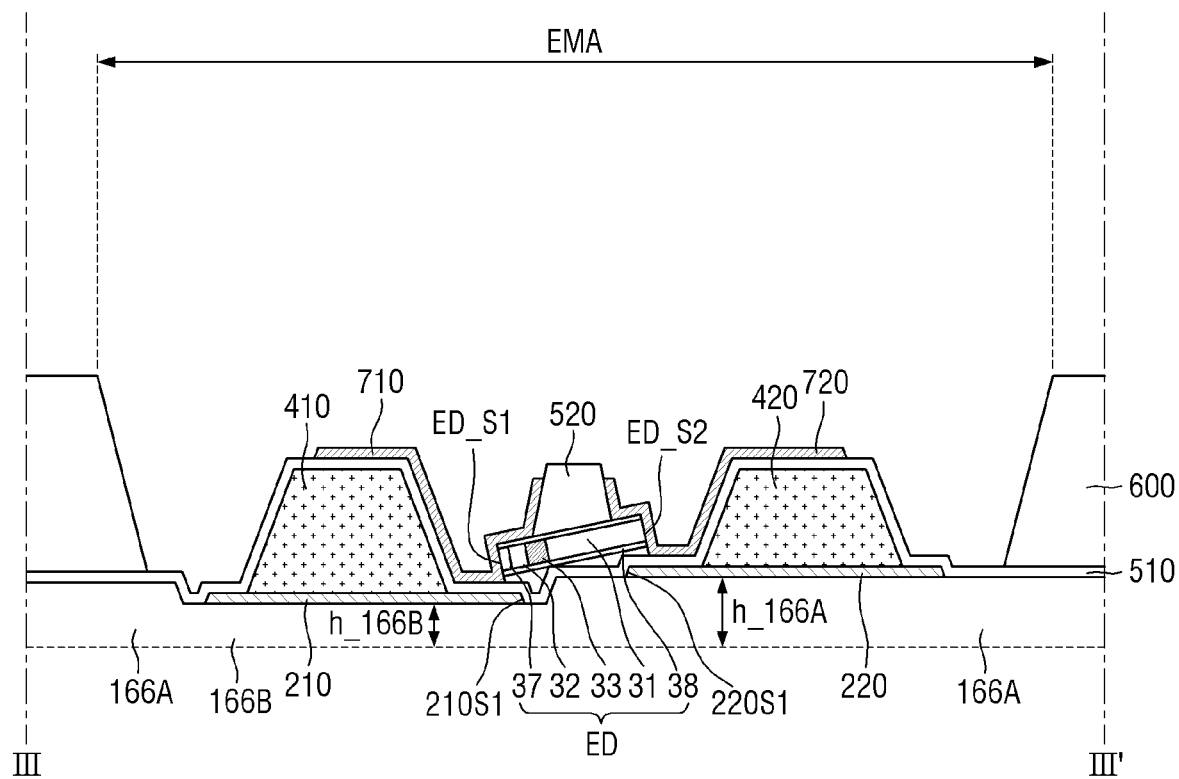
FIG. 22 is a schematic cross-sectional view showing another example, taken along line III-III' of FIG. 2.

FIG. 22 is a schematic cross-sectional view showing another example, taken along line III-III' of FIG. 2.

An embodiment of FIG. 22 may be different from an embodiment shown in FIG. 21 in that the step pattern is eliminated from a display device 10. The following description will focus on the difference and the redundant description will be omitted.

By way of example, a first electrode 210 may be disposed on a second region 166B of a via layer 166_1. A second electrode 220 may be disposed on a first region 166A of the via layer 166_1. The second electrode 220 may be spaced apart from the first electrode 210.

The first sub-bank 410 may be disposed on the second region 166B of the via layer 166_1, and the second sub-bank 420 may be disposed on the first region 166A of the via layer 166_1. The first sub-bank 410 may expose the end 210S1 of the first electrode 210 on the second region 166B of the via layer 166_1, and the second sub-bank 420 may expose the end 220S1 of the second electrode 220 on the first region 166A of the via layer 166_1.

The first insulating layer 510 may be disposed on the first bank 400. The first insulating layer 510 may cover or overlap the outer surface of the end 210S1 of the first electrode 210 exposed by the first sub-bank 410 and the outer surface of the end 220S1 of the second electrode 220 exposed by the second sub-bank 420.

According to this embodiment, even though the step pattern PT is eliminated from the display device 10, the both ends ED_S1 and ED_S2 of the light-emitting element ED are disposed on the first region 166A of the via layer 166_1 and the second region 166B of the via layer 166_1, respectively, which have different heights. Accordingly, the light-emitting element ED can be disposed such that the direction in which the light-emitting element ED is extended is obliquely with respect to the surface of the substrate SUB to have an inclination. For example, even though the step pattern PT is eliminated, the via layer 166_1 may include a step structure, and thus the light-emitting elements ED may be arranged or disposed obliquely with respect to the surface of the substrate SUB to have an inclination, the light-emitting elements ED can be more readily rotated by the same dielectrophoresis force during the process of aligning the light-emitting elements ED. In this manner, the alignment of the light-emitting elements ED can be improved during the process of aligning the light-emitting elements ED among the processes of fabricating the display device 10. Since a process for forming the step pattern PT and a design step for adjusting the thickness and width of the step pattern PT can be omitted, the efficiency of the process of fabricating the display device 10 can be improved.

Hereinafter, a variety of embodiments in which an electrode layer is disposed on a first bank will be described.

Figure 23:
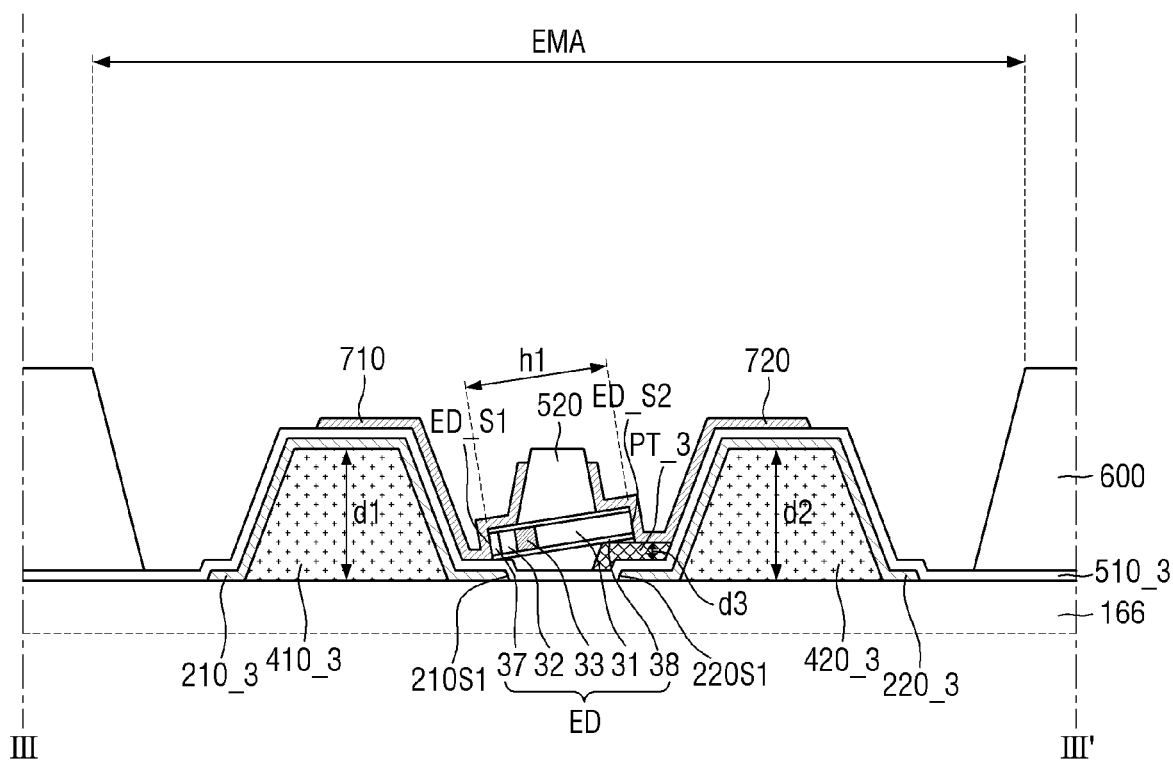
FIG. 23 is a schematic cross-sectional view showing another example, taken along line III-III' of FIG. 2.

FIG. 23 is a schematic cross-sectional view showing another example, taken along line III-III' of FIG. 2.

An embodiment of FIG. 23 may be different from an embodiment of FIG. 7 in that an electrode layer 200_3 is disposed on a first bank 400_3 and a step pattern PT_3 is formed as a different layer from the first bank 400_3 in a display device 10. The following description will focus on the difference and the redundant description will be omitted.

By way of example, the first bank 400_3 may be disposed on the via layer 166. The first bank 400_3 may be disposed on or disposed directly on the upper surface of the via layer 166. A first sub-bank 410_3 and a second sub-bank 520_3 may be disposed on or disposed directly on the upper surface of the via layer 166 and may be spaced apart from each other. The thickness d1 of the first sub-bank 410_3 may be equal to the thickness d2 of the second sub-bank 520_3.

The electrode layer 200_3 may be disposed on the first bank 400_3 in the emission area EMA. As described above, the electrode layer 200_3 may transmit an electric signal applied from the circuit element layer to the light-emitting elements ED to emit light. The electrode layer 200 may also be utilized to generate an electric field used in a process of aligning the light-emitting elements ED so that they are oriented in a direction.

According to this embodiment, the electrode layer 200_3 may include a reflective material so that it can change a traveling direction of light emitted from the light-emitting elements ED toward the display side. The electrode layer 200_3 may include a conductive material having high reflectance. For example, the electrode layer 200_3 may include a metal such as silver (Ag), copper (Cu) and aluminum (Al) as the material having high reflectance, and may include an alloy including aluminum (Al), nickel (Ni), lanthanum (La), etc. within the spirit and the scope of the disclosure. The electrode layer 200_3 can reflect light that is emitted from the light-emitting elements ED and travels toward the side surfaces of the first bank 400 toward the display side of the display device 10.

It is, however, to be understood that the disclosure is not limited thereto. The electrode layer 200_3 may further include a transparent conductive material. For example, the electrode layer 200_3 may include a material such as ITO, IZO and ITZO. In an embodiment, the electrode layer 200_3 may have a structure in which one or more layers of a transparent conductive material and a metal layer having high reflectance may be stacked each other, or may be made up of a single layer including them. For example, the electrode layer 200_3 may have a stack structure such as ITO/Ag/ITO/, ITO/Ag/IZO, or ITO/Ag/ITZO/IZO.

The electrode layer 200_3 may include a first electrode 210_3 and a second electrode 220_3 spaced apart from each other on the first bank 400_3. In an embodiment, the first electrode 210_3 and the second electrode 220_3 may include the same material or a similar material and may be formed on the same layer. For example, the first electrode 210_3 and the second electrode 220_3 may be patterned and formed via a single process.

The first electrode 210_3 may be disposed on the first sub-bank 410_3 in the emission area EMA. The first electrode 210_3 may cover or overlap the outer surface of the first sub-bank 410_3. The first electrode 210_3 may be extended outward from the outer surface of the first sub-bank 410_3 to be partially disposed between the first sub-bank 410_3 and the second sub-bank 420_3. One end 210S1 of the first electrode 210_3 may be disposed on the upper surface of the via layer 166 exposed by the first sub-bank 410_3 and the second sub-bank 420_3 between the first sub-bank 410_3 and the second sub-bank 420_3.

The second electrode 220_3 may be disposed on the second sub-bank 420_3 in the emission area EMA. The second electrode 220_3 may cover or overlap the outer surface of the second sub-bank 420_3. The second electrode 220_3 may be extended outward from the outer surface of the second sub-bank 420_3 to be partially disposed between the first sub-bank 410_3 and the second sub-bank 420_3. One end 220S1 of the second electrode 220_3 may be disposed on the upper surface of the via layer 166 exposed by the first sub-bank 410_3 and the second sub-bank 420_3 between the first sub-bank 410_3 and the second sub-bank 420_3.

The end 210S1 of the first electrode 210_3 and the end 220S1 of the second electrode 220_3 may be spaced apart from each other between the first sub-bank 410_3 and the second sub-bank 420_3. For example, the end 210S1 of the first electrode 210_3 and the end 220S1 of the second electrode 220_3 may be spaced apart from each other between the first sub-bank 410_3 and the second sub-bank 420_3.

The first insulating layer 510_3 may be disposed on the electrode layer 200_3. The first insulating layer 510_3 may be disposed entirely on the via layer 166 on which the electrode layer 200_3 is formed in the emission area EMA. The first insulating layer 510_3 may protect the electrode layer 200_3 in the emission area EMA and may insulate the first electrode 210_3 and the second electrode 220_3 from each other. Although not shown in the drawing, the first insulating layer 510_3 may include a first contact CT1 exposing a part of the upper surface of the first electrode 210_3 and a second contact CT2 exposing a part of the upper surface of the second electrode 220_3 in the subsidiary area SA. The first electrode 210_3 may be electrically connected to a first contact electrode 710 through a first contact CT1 penetrating the first insulating layer 510_3 in the subsidiary area SA, and the second electrode 220_3 may be electrically connected to the second contact electrode 720 through a second contact CT2 penetrating the first insulating layer 510_3 in the subsidiary area SA.

The step pattern PT_3 may be disposed on the first insulating layer 510_3. The step pattern PT_3 may overlap the end 220S1 of the second electrode 220_3. The step pattern PT_3 may not overlap the first electrode 210_3. The step pattern PT_3 may cover or overlap the end 220S1 of the second electrode 220_3 on the first insulating layer 510_3 and may not overlap the first electrode 210_3. The end 220S1 of the second electrode 220_3 covered or overlapped by the step pattern PT_3 does not overlap the second sub-bank 420_3 and may be a part of the second electrode 220_3 facing the first electrode 210_3.

The step pattern PT_3 may include an organic material or an inorganic material. By way of example, the step pattern PT_3 may include an organic insulating material or an inorganic insulating material.

The step pattern PT_3 may be interposed between the second end ED_S2 of the light-emitting element ED and the second electrode 220_3. The step pattern PT_3 may be interposed between the second end ED_S2 of the light-emitting element ED and the first insulating layer 510_3.

The step pattern PT_3 may be formed to have a thickness d3. As described above, the step pattern PT_3 can create a difference in height (or a level difference) between both ends ED_S1 and ED_S2 of the light-emitting element ED to facilitate the rotation of the light-emitting elements ED during the process of aligning of the light-emitting elements ED. By way of example, the step pattern PT_3 may create a difference in height between the first end ED_S1 of the light-emitting element ED placed on the first electrode 210_3 and the second end ED_S2 of the light-emitting element ED placed on the second electrode 220_3, so that the light-emitting element ED is disposed obliquely with respect to the surface of the substrate SUB. Accordingly, the step pattern PT_3 needs to be formed to have a thickness d3 to facilitate rotation of the light-emitting elements ED during a process of aligning the light-emitting elements ED in a direction.

By way of example, the thickness d3 of the step pattern PT_3 may be smaller than the thickness d1 of the first sub-bank 410_3 and the thickness d2 of the second sub-bank 420_3. The thickness d3 of the step pattern PT_3 may be smaller than a length h1 of the light-emitting element ED. Since the thickness d3 of the step pattern PT_3 is formed to be smaller than the length h1 of the light-emitting element ED, the both ends ED_S1 and ED_S2 of the light-emitting element ED may be disposed to overlap the end 210S1 of the first electrode 210_3 and the end 220S1 of the second electrode 220_3, respectively, during the process of aligning the light-emitting elements ED. Since the thickness d3 of the step pattern PT_3 is smaller than the length h1 of the light-emitting element ED, the light-emitting elements ED can be stably fixed on the substrate SUB after the process of aligning the light-emitting elements ED.

The light-emitting element ED may be disposed above the electrode layer 200_3 on which the first insulating layer 510_3 and the step pattern PT_3 are formed. The light-emitting element ED may be disposed between the first electrode 210_3 and the second electrode 220_3. The light-emitting element ED may be disposed such that the both ends ED_S1 and ED_S2 are placed on the end 210S1 of the first electrode 210_3 and the end 220S1 of the second electrode 220_3, respectively.

The first end ED_S1 of the light-emitting element ED may be disposed on the first insulating layer 510_3 overlapping the end 210S1 of the first electrode 210_3. The second end ED_S2 of the light-emitting element ED may be disposed on the step pattern PT_3 overlapping the end 220S1 of the second electrode 220_3. Even though the first electrode 210_3 and the second electrode 220_3 have the same thickness on the same layer, the step pattern PT_3 is disposed only on the second electrode 220_3 to cover or overlap the end 220S1 of the second electrode 220_3, so that the height of the first end ED_S1 of the light-emitting element ED may be different from the height of the second end ED_S2 of the light-emitting element ED. By way of example, the height of the first end ED_S1 of the light-emitting element ED may be lower than the height of the second end ED_S2 of the light-emitting element ED. A difference in height between the first end ED_S1 of the light-emitting element ED and the second end ED_S2 of the light-emitting element ED may be substantially equal to the thickness d3 of the step pattern PT_3.

In a region adjacent to the light-emitting element ED, the first contact electrode 710 may be in contact with or direct contact with the outer surface of the first insulating layer 510_3, and the second contact electrode 720 may be in contact with or direct contact with the upper surface of the step pattern PT_3 and the outer surface of the first insulating layer 510_3 exposed by the step pattern PT_3.

According to this embodiment, even though the first bank 400_3 including the first sub-bank 410_3 and the second sub-bank 420_3 having the same shape or substantially the same shape is formed prior to the electrode layer 200_3, the step pattern PT_3 is formed via a subsequent process, so that there can be created a difference in height between the both ends ED_S1 and ED_S2 of the light-emitting elements ED, which is equal to the thickness d3 of the step pattern PT_3. Accordingly, as the light-emitting elements ED may be arranged or disposed obliquely with respect to the surface of the substrate SUB to have an inclination, the light-emitting elements ED can be more readily rotated by the dielectrophoresis force during the process of aligning the light-emitting elements ED. In this manner, the alignment of the light-emitting elements ED can be improved during the process of aligning the light-emitting elements ED among the processes of fabricating the display device 10.

Figure 24:
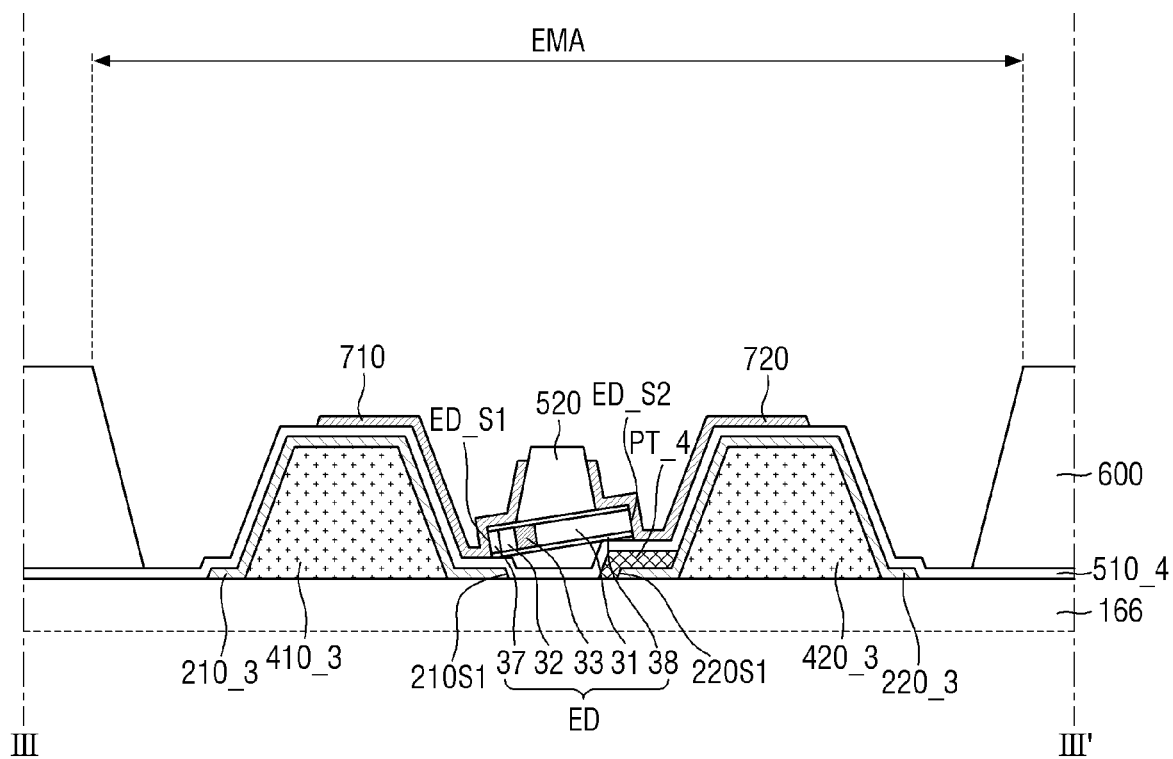
FIG. 24 is a schematic cross-sectional view showing another example, taken along line III-III' of FIG. 2.

FIG. 24 is a schematic cross-sectional view showing another example, taken along line III-III' of FIG. 2.

An embodiment of FIG. 24 may be different from an embodiment of FIG. 23 in that a first insulating layer 510_4 is disposed to cover or overlap a step pattern PT_4 and an electrode layer 200 in a display device 10. The following description will focus on the difference and the redundant description will be omitted.

By way of example, the step pattern PT_4 may be disposed on the via layer 166 on which the first bank 400_3 and the electrode layer 200_3 are formed. The step pattern PT_4 may overlap the end 220S1 of the second electrode 220_3. The step pattern PT_4 may not overlap the first electrode 210_3. The step pattern PT_4 may be disposed on or disposed directly on the end 220S1 of the second electrode 220_3. The step pattern PT_4 may be disposed on or directly disposed on the upper surface and the side surface of the end 220S1 of the second electrode 220_3, and may cover or overlap the end 220S1 of the second electrode 220_3. The step pattern PT_4 may cover or overlap the second electrode 220_3 and may not overlap the first electrode 210_3.

The first insulating layer 510_4 may be disposed on the electrode layer 200_3 and the step pattern PT_4. The first insulating layer 510_4 may be disposed to cover or overlap the upper and side surface of the step pattern PT_4.

The light-emitting element ED may be disposed on the first insulating layer 510_4. The first end ED_S1 of the light-emitting element ED may be disposed on the first insulating layer 510_4 overlapping the end 210S1 of the first electrode 210_3. The second end ED_S2 of the light-emitting element ED may be disposed on the first insulating layer 510_4 overlapping the end 220S1 of the second electrode 220_3 and the step pattern PT_4.

According to this embodiments, even though the first insulating layer 510_4 is formed after the step pattern PT_4 has been formed, the step pattern PT_4 is formed to cover or overlap the end 220S1 of the second electrode 220 facing the first electrode 210, and thus the first electrode 210 and the second electrode 220 can be electrically insulated from each other by the step pattern PT_4 in the emission area EMA.

Figure 25:
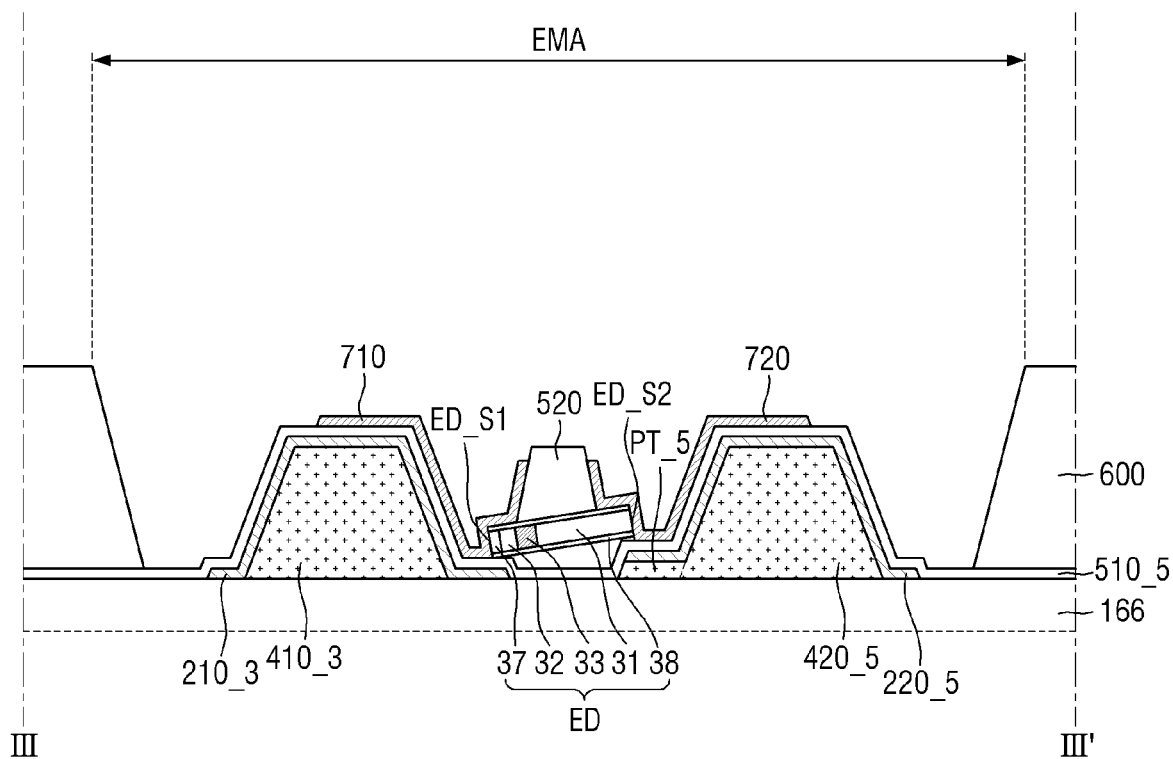
FIG. 25 is a schematic cross-sectional view showing another example, taken along line III-III' of FIG. 2.

FIG. 25 is a schematic cross-sectional view showing another example, taken along line III-III' of FIG. 2.

An embodiment of FIG. 25 may be different from an embodiment of FIG. 24 in that a step pattern PT_5 and a first bank 400_5 are formed as the same layer in a display device 10, and an electrode layer 200_5 is disposed on the step pattern PT_5 and the first bank 400_5. The following description will focus on the difference and the redundant description will be omitted.

By way of example, the step pattern PT_5 and the first bank 400_5 may include the same material or a similar material. The step pattern PT_5 and the first bank 400_5 may be formed on the same layer. For example, the first bank 400_5 and the step pattern PT_5 may be formed simultaneously via the same process.

The step pattern PT_5 may be integrated with the second sub-bank 420_5. For example, the step pattern PT_5 and the second sub-bank 420_5 may be formed as a single first pattern integrated with each other via the same process. The first pattern may include a first portion having a first thickness and a second portion having a second thickness smaller than the first thickness. The first portion of the first pattern may correspond to the second sub-bank 420_5, and the second portion of the first pattern may correspond to the step pattern PT_5.

According to this embodiment, the first sub-bank 410_3 and the second sub-bank 420_5 may be spaced apart from each other. The step pattern PT_5 may be disposed between the first sub-bank 410_3 and the second sub-bank 420_5. The step pattern PT_5 may be spaced apart from the first sub-bank 410_3. The step pattern PT_5 may be disposed on one side or a side of the second sub-bank 420_5 facing the first sub-bank 410_3. The step pattern PT_5 may be a protruding pattern protruding toward the first sub-bank 410_3 from one side surface or a side surface of the second sub-bank 420_5 facing the first sub-bank 410_3.

The electrode layer 200_5 may be disposed on the first bank 400_5 and the protruding pattern PT_5. By way of example, the first electrode 210_3 may be disposed on the first sub-bank 410_3, and the second electrode 220_5 may be disposed on the second sub-bank 420_5 and the protruding pattern PT_5 which may be integral with each other. The second electrode 220_5 may be disposed to cover or overlap the upper surface of the protruding pattern PT_5 and the upper and side surfaces of the second sub-bank 420_5.

The first insulating layer 510_5 may be disposed on the electrode layer 200_5. The first insulating layer 510_5 may be disposed on or disposed directly on the first electrode 210_3 and the second electrode 220_5 to cover or overlap them.

According to this embodiment, by forming the protruding pattern PT_5 and the second sub-bank 420_5 via the same process, no additional process for forming the protruding pattern PT_5 is required. As a result, the efficiency of the process of fabricating the display device 10 can be improved.

Figure 26:
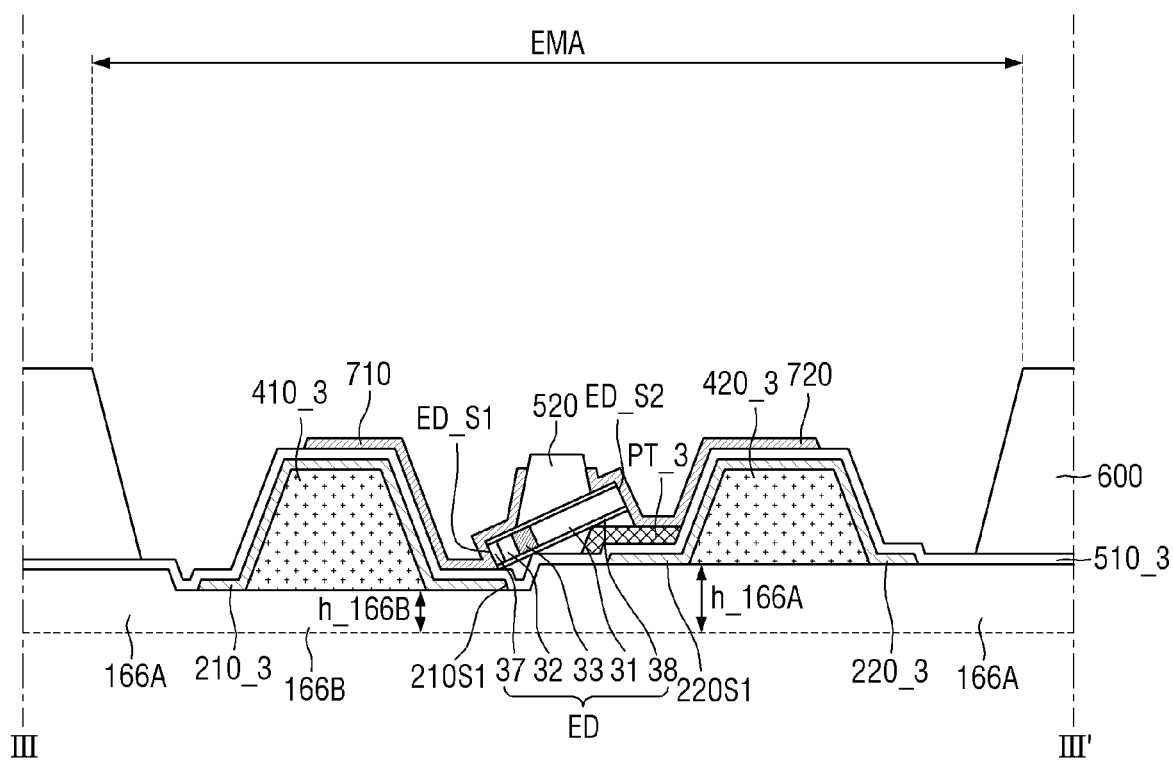
FIG. 26 is a schematic cross-sectional view showing another example, taken along line III-III' of FIG. 2.

FIG. 26 is a schematic cross-sectional view showing another example, taken along line III-III' of FIG. 2.

An embodiment of FIG. 26 may be different from an embodiment of FIG. 23 in that a via layer 166_1 on which a display element layer is disposed in a display device 10 may include a first region 166A and a second region 166B having different heights. The following description will focus on the difference and the redundant description will be omitted.

By way of example, similar to an embodiment of FIG. 21, the via layer 166_1 may include a step structure. The via layer 166_1 may include a first region 166A having a first height h_166A and a second region 166B having a second height h_166B lower than the first height h_166A.

The first sub-bank 410_3 may be disposed on the second region 166B of the via layer 166_1. The first sub-bank 410_3 may be disposed on or disposed directly on the upper surface of the second region 166B of the via layer 166_1.

The second sub-bank 420_3 may be disposed on the first region 166A of the via layer 166_1. The second sub-bank 420_3 may be disposed on or disposed directly on the upper surface of the first region 166A of the via layer 166_1.

The first electrode 210_3 may overlap the second region 166B of the via layer 166_1. The first electrode 210_3 may be disposed to cover or overlap the outer surface of the first sub-bank 410_3 and may be extended outward from the outer surface of the first sub-bank 410_3 to be partially disposed also in the second region 166B of the via layer 166_1 exposed by the first sub-bank 410_3.

The second electrode 220_3 may overlap the first region 166A of the via layer 166_1. The second electrode 220_3 may be disposed to cover or overlap the outer surface of the second sub-bank 420_3 and may be extended outward from the outer surface of the second sub-bank 420_3 to be partially disposed also in the first region 166A of the via layer 166_1 exposed by the second sub-bank 420_3.

Accordingly, the end 210S1 of the first electrode 210_3 may be disposed in the second region 166B of the via layer 166_1, and the end 220S1 of the second electrode 220_3 may be disposed in the first region 166A of the via layer 166_1. Accordingly, the height of the end 210S1 of the first electrode 210_3 may be different from the height of the end 220S1 of the second electrode 220_3. By way of example, the height of the end 210S1 of the first electrode 210_3 may be lower than the height of the end 220S1 of the second electrode 220_3.

The step pattern PT_3 may be disposed to cover or overlap the end 220S1 of the second electrode 220_3. The step pattern PT_3 may be disposed on the first region 166A of the via layer 166_1. The step pattern PT_3 may not be disposed on the second region 166B of the via layer 166_1.

According to this embodiment, the both ends ED_S1 and ED_S2 of the light-emitting element ED are disposed on the first region 166A of the via layer 166_1 and the second region 166B of the via layer 166_1, respectively, which have different heights. Accordingly, the inclination of the direction in which the light-emitting element ED is extended with respect to the surface of the substrate SUB can be further increased compared to an embodiment where only the step pattern PT_3 is disposed. In other words, as the via layer 166_1 has the step structure, a difference between the height of the first end ED_S1 of the light-emitting element ED and the height of the second end ED_S2 of the light-emitting element ED from the surface of the substrate SUB can become larger. Accordingly, as the light-emitting elements ED may be arranged or disposed obliquely with respect to the surface of the substrate SUB to have a larger inclination, the light-emitting elements ED can be more readily rotated by the same dielectrophoresis force during the process of aligning the light-emitting elements ED. For example, the step structure of the via layer 166_1 can assist the step pattern PT_3 so that the light-emitting elements ED are aligned obliquely with respect to the surface of the substrate SUB. In this manner, the alignment of the light-emitting elements ED can be improved during the process of aligning the light-emitting elements ED among the processes of fabricating the display device 10.

Figure 27:
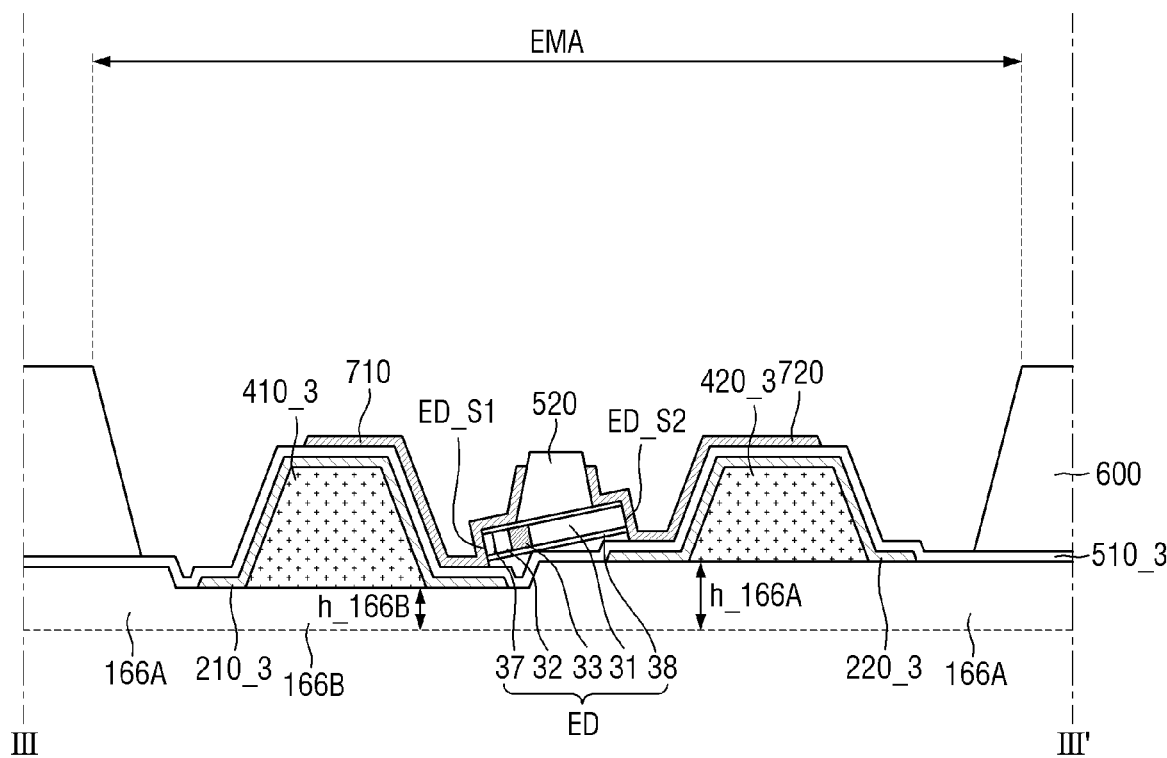
FIG. 27 is a schematic cross-sectional view showing another example, taken along line III-III' of FIG. 2.

FIG. 27 is a schematic cross-sectional view showing another example, taken along line III-III' of FIG. 2.

An embodiment of FIG. 27 may be different from an embodiment shown in FIG. 26 in that the step pattern is eliminated from a display device 10. The following description will focus on the difference and the redundant description will be omitted.

According to this embodiment, the step pattern PT_3 may be eliminated from the display device 10. Accordingly, the first end ED_S1 of the light-emitting element ED may be disposed on the first insulating layer 510_3 overlapping the end 210S1 of the first electrode 210_3, and the second end ED_S2 of the light-emitting element ED may be disposed on the first insulating layer 510_3 overlapping the end 220S1 of the second electrode 220_3.

According to this embodiment, even though the step pattern PT_3 is eliminated from the display device 10, the both ends ED_S1 and ED_S2 of the light-emitting element ED are disposed on the first region 166A of the via layer 166_1 and the second region 166B of the via layer 166_1, respectively, which have different heights. Accordingly, the light-emitting element ED can be disposed such that the direction in which the light-emitting element ED is extended is obliquely with respect to the surface of the substrate SUB to have an inclination. For example, even though the step pattern PT is eliminated, as the light-emitting elements ED may be arranged or disposed obliquely with respect to the surface of the substrate SUB to have an inclination, the light-emitting elements ED can be more readily rotated by the same dielectrophoresis force during the process of aligning the light-emitting elements ED. In this manner, the alignment of the light-emitting elements ED can be improved during the process of aligning the light-emitting elements ED among the processes of fabricating the display device 10.

In concluding the detailed description, those skilled in the art will appreciate that many variations and modifications can be made to the embodiments without substantially departing from the principles of the disclosure. Therefore, the disclosed embodiments are used in a generic and descriptive sense only and not for purposes of limitation.

What is claimed is:

1. A display device comprising:
   a first electrode and a second electrode spaced apart from each other and disposed on a substrate;
   a first sub-bank disposed on the first electrode and exposing an end of the first electrode facing the second electrode;
   a second sub-bank disposed on the second electrode and exposing an end of the second electrode facing the first electrode;
   a step pattern disposed on the second electrode and overlapping at least the end of the second electrode; and
   a light-emitting element disposed between the first sub-bank and the second sub-bank.

2. The display device of claim 1, wherein a thickness of the step pattern is less than a thickness of the second sub-bank.

3. The display device of claim 2, wherein the step pattern and the second sub-bank are integral with each other.

4. The display device of claim 1, wherein
   a first end of the light-emitting element is disposed on the end of the first electrode, and
   a second end of the light-emitting element is disposed on the end of the second electrode and the step pattern.

5. The display device of claim 4, wherein a distance between the first end of the light-emitting element and a surface of the substrate is less than a distance between the second end of the light-emitting element and the surface of the substrate.

6. The display device of claim 4, wherein the step pattern is disposed between the second electrode and the second end of the light-emitting element.

* * * * *